(12) United States Patent
Kawashima

(10) Patent No.: US 6,897,743 B2
(45) Date of Patent: May 24, 2005

(54) ELECTRONIC APPARATUS WITH TWO QUARTZ CRYSTAL OSCILLATORS UTILIZING DIFFERENT VIBRATION MODES

(75) Inventor: Hirofumi Kawashima, Tokyo (JP)

(73) Assignee: Piedek Technical Laboratory, Tokyo (JP)

( * ) Notice: Subject to any disclaimer, the term of this patent is extended or adjusted under 35 U.S.C. 154(b) by 0 days.

(21) Appl. No.: 10/378,724

(22) Filed: Mar. 4, 2003

(65) Prior Publication Data

US 2003/0169130 A1 Sep. 11, 2003

(30) Foreign Application Priority Data

Mar. 6, 2002 (JP) ..................... 2002-060827
Jan. 10, 2003 (JP) ..................... 2003-038962

(51) Int. Cl.[7] ............... H03B 5/32; H03B 5/36; H03H 9/21
(52) U.S. Cl. ............ 333/187; 333/200; 331/107 A; 331/156; 310/370
(58) Field of Search ................. 333/200, 186, 333/187; 331/107 A, 156; 310/370

(56) References Cited

U.S. PATENT DOCUMENTS

| | | | |
|---|---|---|---|
| 4,313,071 A | * 1/1982 | Hermann et al. | 310/361 |
| 4,320,320 A | * 3/1982 | Momosaki et al. | 310/361 |
| 4,384,232 A | * 5/1983 | Debely | 310/370 |
| 4,469,979 A | * 9/1984 | Chuang | 310/370 |
| 5,166,645 A | * 11/1992 | Watts | 331/37 |
| 5,285,127 A | * 2/1994 | Egley et al. | 310/366 |
| 6,208,266 B1 | * 3/2001 | Lyons et al. | 340/870.02 |
| 6,541,897 B2 | * 4/2003 | Endoh | 310/344 |
| 6,587,009 B2 | * 7/2003 | Kitamura et al. | 331/158 |

* cited by examiner

*Primary Examiner*—Barbara Summons
(74) *Attorney, Agent, or Firm*—Adams & Wilks

(57) ABSTRACT

An electronic apparatus has a display portion and quartz crystal oscillators having different modes of vibration. Each of the quartz crystal oscillators has a quartz crystal oscillating circuit having a quartz crystal resonator. The quartz crystal resonator of one of the quartz crystal oscillating circuits is a width-extensional mode quartz crystal resonator capable of vibrating in a width-extensional mode. The width-extensional mode quartz crystal resonator has a vibrational portion, connecting portions disposed at ends of the vibrational portion, supporting portions connected to the vibrational portion through the connecting portions, and electrodes disposed on upper and lower surfaces of the vibrational portion. The quartz crystal oscillating circuit having the width-extensional mode quartz crystal resonator outputs a clock signal for operating the electronic apparatus to display time information at the display portion.

43 Claims, 12 Drawing Sheets

ELECTRONIC APPARATUS WITH TWO QUARTZ CRYSTAL OSCILLATORS UTILIZING DIFFERENT VIBRATION MODES

BACKGROUND OF THE INVENTION

1. Field of the Invention

The present invention relates to an electronic apparatus comprising at least a display portion and a quartz crystal oscillator.

2. Background Information

There are many electronic apparatuses comprising at least a display portion and a quartz crystal oscillator. For example, cellular phones, wristwatches and pagers comprising a quartz crystal oscillator are well known. Recently, because of high stability for frequency, miniaturization and the light weight nature of these electronic apparatus, the need for an electronic apparatus comprising a smaller quartz crystal oscillator with a high frequency stability has arisen. For example, the quartz crystal oscillator with a quartz crystal tuning fork resonator, which is capable of vibrating in a flexural mode, is widely used as a time standard in an electronic apparatus such as cellular phones, wristwatches and pagers. Similar to this, the same need has also arisen for an electronic apparatus comprising a width-extensional mode quartz crystal resonator and a thickness shear mode quartz crystal resonator.

Heretofore, however, it has been impossible to obtain an electronic apparatus comprising a smaller quartz crystal oscillator with a conventional miniaturized quartz crystal tuning fork resonator, capable of vibrating in a flexural mode, and having a high frequency stability, a small series resistance and a high quality factor. When miniaturized, the conventional quartz crystal tuning fork resonator capable of vibrating in a flexural mode, as shown in FIG. 10 (which has electrodes on the obverse faces 203, 207, reverse faces 204, 208 and the four sides 205, 206, 209, 210 of each tuning fork tine, as also shown in FIG. 11—a cross-sectional view of tuning fork tines of FIG. 10), it has a smaller electromechanical transformation efficiency because the resonator shape and the electrode construction provide a small electric field (i.e. Ex becomes small), as a result of which the resonator has a low frequency stability, a large series resistance and a reduced quality factor. In FIG. 10, a conventional tuning fork resonator 200 is shown with tuning fork tines 201, 202 and a tuning fork base 230.

Moreover, for example, Japanese Patent Nos. P56-65517 and P2000-223992A and International Patent No. WO 00/44092 were published and teach grooves and electrodes constructed at tuning fork tines of a flexural mode, tuning fork, quartz crystal resonator. However, they teach nothing about a quartz crystal oscillator of the present invention having novel shape, novel electrode construction and figure of merit M for a quartz crystal tuning fork resonator, capable of vibrating in a flexural mode and about a relationship of an amplification circuit and a feedback circuit which construct a quartz crystal oscillating circuit.

Additionally, for example, there has been a big problem in the conventional quartz crystal oscillator with the conventional quartz crystal tuning fork resonator, such that a fundamental mode vibration of the resonator jumps to a second overtone mode vibration by shock or vibration.

In addition, as a quartz crystal resonator of the prior art, a NS-GT cut coupling quartz crystal resonator which vibrates in the coupled width-extensional mode and length-extensional mode is well known. FIG. 12a and FIG. 12b show a top view and a side view of the conventional NS-GT cut coupling quartz crystal resonator. In FIG. 12a and FIG. 12b, the resonator 300 comprises a vibrational portion 301, connecting portions 303, 306 and supporting portions 304, 307. The supporting portions 304 and 307 include respective mounting portions 305 and 308.

Likewise, as shown in FIG. 12a and FIG. 12b, electrodes 302 and 311 are disposed on the upper and lower faces of the vibrational portion 301, the electrode 302 extends to the mounting portion 305 through the connecting portion 303, while the electrode 311 extends to the mounting portion 308 through the connecting portion 306. The electrodes 302 and 311 have opposite electrical polarities, and two electrode terminals are constructed.

Now, when an alternating-current(AC) voltage is applied between the electrodes 302 and 311, an electric field $E_t$ occurs alternately in the thickness T direction, as shown by arrow signs of the solid and broken lines in FIG. 12b. As a result, the coupled width-extensional mode and the length-extensional mode whose frequencies are inversely proportional to width W and length L of the vibrational portion, respectively, can be excited at the same time, and the NS-GT cut coupling resonator coupled in inverse phase is provided. The above-mentioned resonator is formed integrally by a chemical etching process.

Furthermore, the lager the area of vibrational portion for the NS-GT cut resonator becomes (low frequency), the smaller series resistance $R_1$ becomes and the larger a quality factor Q becomes. Also, the NS-GT cut resonator with excellent frequency temperature behavior is determined by a dimensional ratio W/L, and which has a value of 0.95 approximately. In order to get a frequency higher than 4 MHz, it is necessary to decrease the area of the vibrational portion for the resonator.

According to the miniaturization and the light weight nature of an electronic apparatus comprising a quartz crystal oscillator with an output signal of a frequency higher than 4 Mhz, a miniature quartz crystal oscillator comprising a NS-GT cut resonator with the higher frequency is also required with a small series resistance $R_1$ and high quality factor Q.

It has been, however, impossible to provide an electronic apparatus comprising a miniature quartz crystal oscillator having a NS-GT cut resonator with a frequency higher than about 4 Mhz with a small series resistance $R_1$ and a high quality factor Q because the area of vibrational portion for the resonator becomes very small to get the higher frequency, and more an electromechanical transformation efficiency becomes very small, so that a series resistance $R_1$ becomes large and a quality factor Q also becomes small.

It is, therefore, a general object of the present invention to provide embodiments of an electronic apparatus and a quartz crystal oscillator, which constructs an electronic apparatus of the present invention, comprising a quartz crystal oscillating circuit with a flexural mode, quartz crystal tuning fork resonator, capable of vibrating in a fundamental mode, and having a high frequency stability, a small series resistance and a high quality factor, or embodiments of a quartz crystal oscillator, which also constructs an electronic apparatus of the present invention, comprising a quartz crystal oscillating circuit with a width-extensional mode quartz crystal resonator having a frequency higher than 4 Mhz, a small series resistance and a high quality factor, which overcome or at least mitigate one or more of the above problems.

SUMMARY OF THE INVENTION

The present invention relates to an electronic apparatus comprising at least a display portion and a quartz crystal oscillator. The quartz crystal oscillator comprises a quartz crystal oscillating circuit having an amplification circuit and a feedback circuit. The quartz crystal oscillating circuit comprises a flexural mode, quartz crystal tuning fork resonator capable of vibrating in a fundamental mode and having a high frequency stability for the fundamental mode vibration, and a suppressed second overtone mode vibration of the flexural mode. In another embodiment, the quartz crystal oscillator comprises a quartz crystal oscillating circuit comprising a width-extensional mode quartz crystal resonator. The quartz crystal oscillators are, therefore, available for the electronic apparatus requiring miniaturized and low priced quartz crystal oscillators with high time accuracy and shock proof.

It is an object of the present invention to provide an electronic apparatus comprising at least a display portion and a quartz crystal oscillator.

It is an another object of the present invention to provide an electronic apparatus comprising a quartz crystal oscillator comprising a quartz crystal oscillating circuit with a miniature quartz crystal tuning fork resonator, capable of vibrating in a flexural mode, and having a high frequency stability, a small series resistance $R_1$ and a high quality factor $Q_1$, whose frequency for a fundamental mode vibration is within a range of 10 kHz to 200 kHz.

It is a further object of the present invention to provide an electronic apparatus comprising a quartz crystal oscillator comprising a quartz crystal oscillating circuit with a flexural mode, quartz crystal tuning fork resonator, capable of vibrating in a fundamental mode, and having a high frequency stability which gives a high time accuracy.

It is a still further object of the present invention to provide an electronic apparatus comprising a quartz crystal oscillator comprising a quartz crystal oscillating circuit with a width-extensional mode quartz crystal resonator or a thickness shear mode quartz crystal resonator.

According to one aspect of the present invention, there is provided an electronic apparatus comprising a display portion and a quartz crystal oscillator at least, and the electronic apparatus comprises at least two quartz crystal oscillators and each of two quartz crystal oscillators of the at least two quartz crystal oscillators comprises: a quartz crystal oscillating circuit comprising; one quartz crystal resonator of at least two quartz crystal resonators which are capable of vibrating in a different mode, respectively, in addition, the each quartz crystal oscillator comprises the quartz crystal oscillating circuit comprising an amplification circuit comprising an amplifier at least and a feedback circuit comprising the one quartz crystal resonator and capacitors at least, and the one quartz crystal resonator is a quartz crystal tuning fork resonator capable of vibrating in a flexural mode. Especially, the quartz crystal tuning fork resonator is capable of vibrating in a fundamental mode and comprises; tuning fork tines each of which has a length, a width and a thickness and the length greater than the width and the thickness, and a tuning fork base, said tuning fork tines and said tuning fork base that are formed integrally, grooves provided at said tuning fork tines, and electrodes disposed opposite each other inside the grooves and on sides of said tuning fork tines so that the electrodes disposed opposite each other are of opposite electrical polarity and said tuning fork tines are capable of vibrating in inverse phase.

According to a second aspect of the present invention there is provided an electronic apparatus comprising a display portion and a quartz crystal oscillator at least, and the electronic apparatus comprises at least two quartz crystal oscillators and each of two quartz crystal oscillators of the at least two quartz crystal oscillators comprises: a quartz crystal oscillating circuit comprising; one quartz crystal resonator of at least two quartz crystal resonators which are capable of vibrating in a different mode, respectively, in addition, the each quartz crystal oscillator comprises the quartz crystal oscillating circuit comprising an amplification circuit comprising an amplifier at least and a feedback circuit comprising the one quartz crystal resonator and capacitors at least, and the one quartz crystal resonator is a width-extensional mode quartz crystal resonator capable of vibrating in a width-extensional mode or a thickness shear mode quartz crystal resonator capable of vibrating in a thickness shear mode.

Embodiments of the present invention use grooves and an electrode construction arranged on tuning fork tines and/or a tuning fork base of a flexural mode, quartz crystal tuning fork resonator.

Preferably, the tuning fork resonator has grooves including the central line of the central portions for each tuning fork tine and the electrodes disposed inside the grooves and disposed on the sides of each tuning fork tine, and the grooves and the electrodes are constructed so that figure of merit $M_1$ of a fundamental mode vibration is larger than figure of merit $M_2$ of a second overtone mode vibration.

Preferably, the quartz crystal oscillator with the tuning fork resonator is constructed so that a ratio of an amplification rate $\alpha_1$ of the fundamental mode vibration and an amplification rate $\alpha_2$ of the second overtone mode vibration of said amplification circuit is larger than that of a feedback rate $\beta_2$ of the second overtone mode vibration and a feedback rate $\beta_1$ of the fundamental mode vibration of said feedback circuit, and a product of the amplification rate $\alpha_1$ and the feedback rate $\oplus_1$ of the fundamental mode vibration is larger than 1.

Preferably, the quartz crystal oscillator with the tuning fork resonator is constructed so that a ratio of an absolute value of negative resistance, $|-RL_1|$ of the fundamental mode vibration of said amplification circuit and series resistance $R_1$ of the fundamental mode vibration is larger than that of an absolute value of negative resistance, $|-RL_2|$ of the second overtone mode vibration of said amplification circuit and series resistance $R_2$ of the second overtone mode vibration.

Preferably, the width-extensional mode quartz crystal resonator comprises a vibrational portion, connecting portions and supporting portions, which are formed integrally by a particle method.

The present invention will be more fully understood by referring to the following detailed specification and claims taken in connection with the appended drawings.

DETAILED DESCRIPTION OF THE PREFERRED EMBODIMENTS

Figure 1:
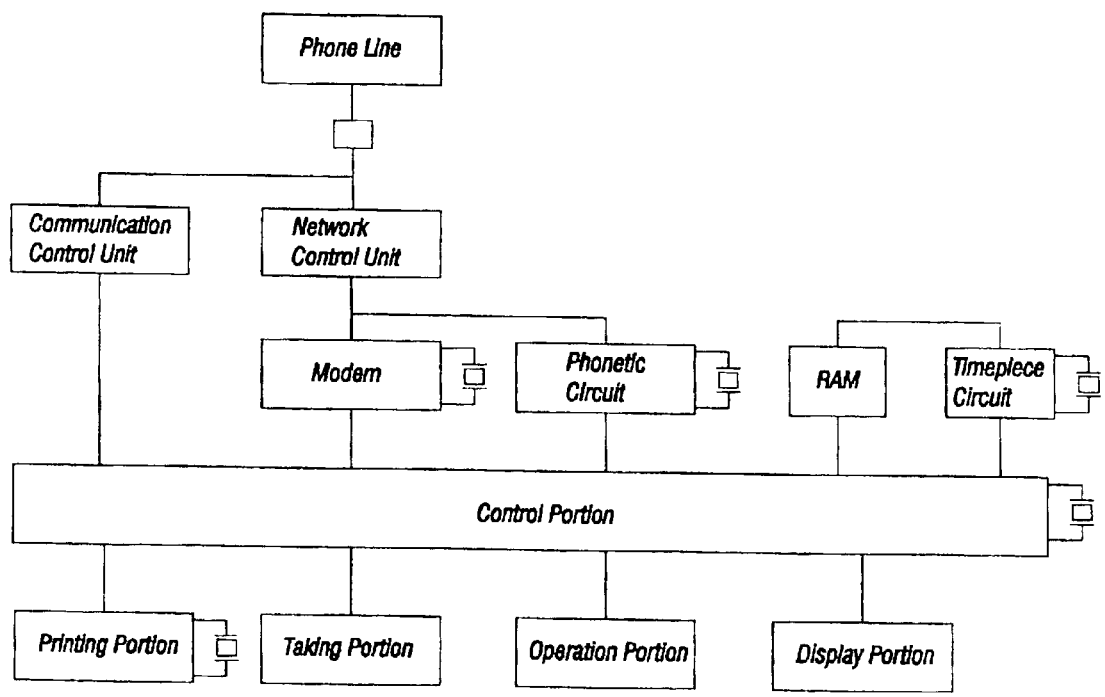
FIG. 1 shows a block diagram of an embodiment of an electronic apparatus of the present invention, and illustrating the diagram of a facsimile apparatus.

Referring now to the drawings, the embodiments of the present invention will be described in more detail.

FIG. 1 shows a block diagram of an embodiment of an electronic apparatus of the present invention, and illustrating the diagram of a facsimile apparatus. As is shown in FIG. 1, the apparatus generally comprises a modem, a phonetic circuit, a timepiece circuit, a printing portion, a taking portion, an operation portion and a display portion. In this principle, perception and scanning of reflection light of light projected on manuscript in the taking portion are performed by CCD(Charge Coupled Device), in addition, light and shade of the reflection light are transformed into a digital signal, and the signal is modulated by the modem and is sent to a phone line(Communication line). Also, in a receiving side, a received signal is demodulated by the modem and is printed on a paper in the print portion by synchronizing the received signal with a signal of a sending side.

As shown in FIG. 1, a quartz crystal resonator is used as a CPU clock of the control portion and the printing portion, and as a clock of the phonetic circuit and the modem, and as a time standard of the timepiece Namely, the quartz crystal resonator constructs a quartz crystal oscillator and an output signal of the oscillator is used. For example, it is used as a signal to display time at the display portion. In order to get the facsimile apparatus of this embodiment which operates normally, an accuracy output signal of the quartz crystal oscillator is required for the facsimile apparatus, which is one of the electronic apparatus of the present invention. Also, a digital display and an analogue display are included in the display of the present invention.

In this embodiment, though the facsimile apparatus is shown as an example of an electronic apparatus, the present invention is not limited to this, namely, the present invention includes all electronic apparatus comprising a quartz crystal oscillator, for example, a cellular phone, telephone, TV set, camera, video set, video camera, pagers, personal computer, printer, CD player, MD player, electronic musical instrument, car navigator, car electronics, timepiece, IC card and so forth.

Figure 2:
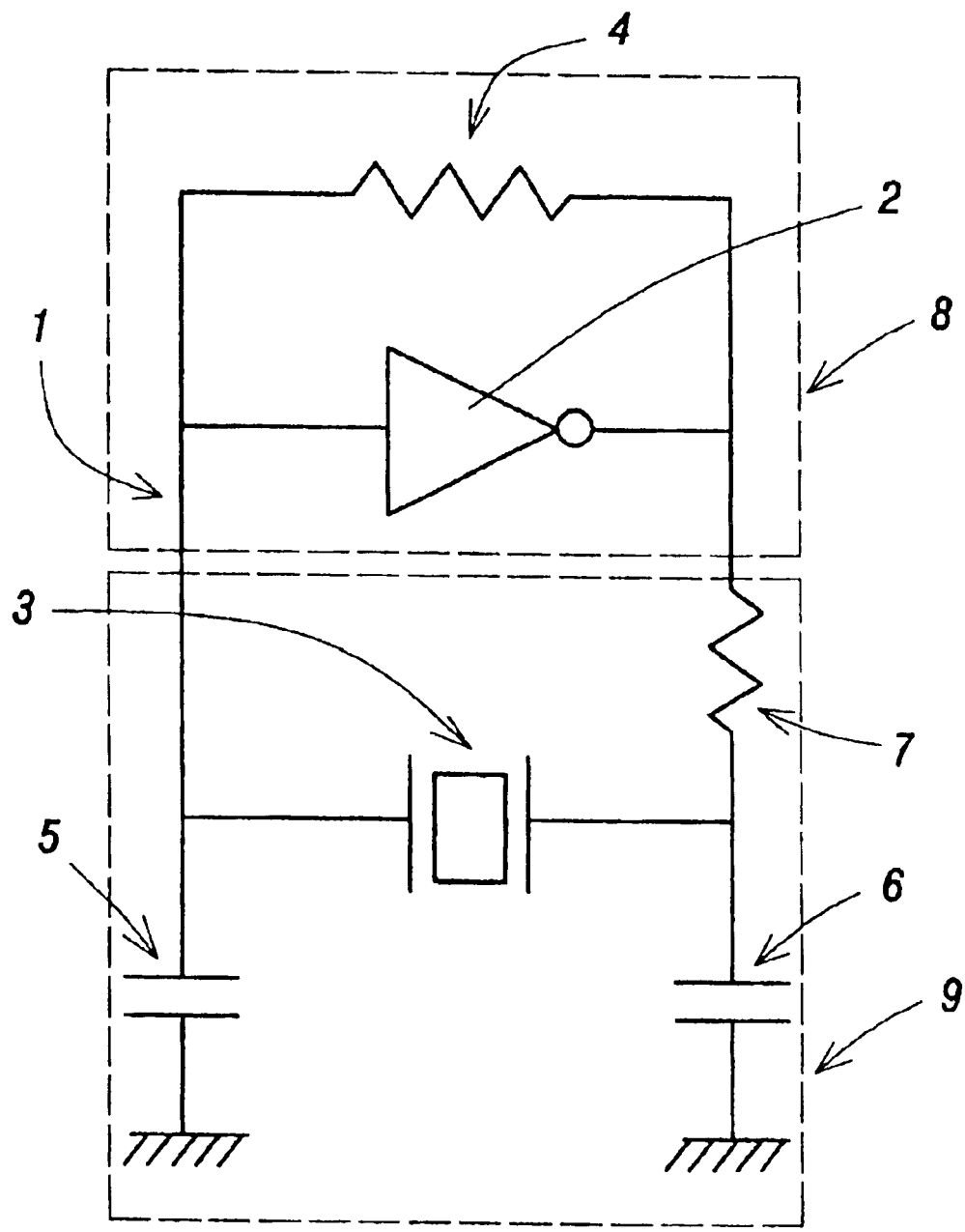
FIG. 2 shows a diagram of an embodiment of a quartz crystal oscillating circuit constructing a quartz crystal oscillator, which constructs an electronic apparatus of the present invention.

FIG. 2 shows a diagram of an embodiment of a quartz crystal oscillating circuit constructing a quartz crystal oscillator, which constructs an electronic apparatus of the present invention The quartz crystal oscillating circuit 1 comprises an amplifier (CMOS Inverter) 2, a feedback resistor 4, drain resistor 7, capacitors 5, 6 and a flexural mode, quartz crystal tuning fork resonator 3. Namely, the quartz crystal oscillating circuit 1 comprises an amplification circuit 8 having the amplifier 2 and the feedback resistor 4, and a feedback circuit 9 having the drain resistor 7, the capacitors 5, 6 and the resonator 3. In addition, an output signal of the oscillating circuit 1 comprising the resonator 3, capable of vibrating in a fundamental mode, is outputted through a buffer circuit (not shown in FIG. 2) from an output side of the amplifier (CMOS Inverter).

In detail, a frequency of the fundamental mode vibration is outputted through a buffer circuit as an output signal. According to the present invention, the frequency of the fundamental mode vibration is within a range of 10 kHz to 200 kHz. Also, the present invention includes a divided frequency of the output signal with the frequency of the fundamental mode vibration by a divided circuit. In more detail, the oscillator comprises the quartz crystal oscillating circuit and the buffer circuit, in other words, the oscillating circuit comprises the amplification circuit and the feedback circuit, and the amplification circuit comprises the amplifier at least and the feedback circuit comprises the flexural mode, quartz crystal tuning fork resonator and the capacitors at least. Also, flexural mode, quartz crystal tuning fork resonators which are used in a quartz crystal oscillator will be described in FIG. 4–FIG. 6 in detail.

Figure 3:
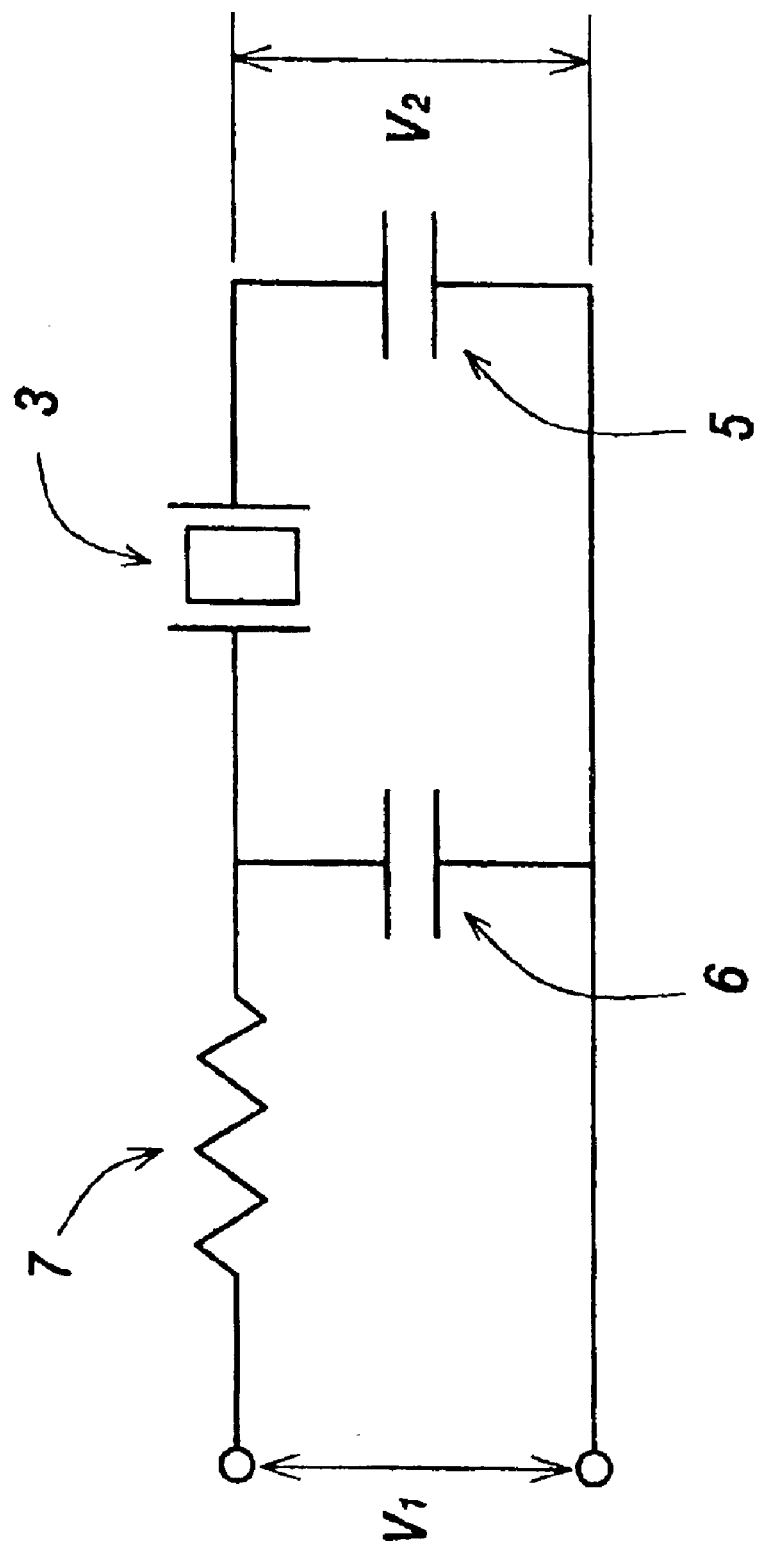
FIG. 3 shows a diagram of the feedback circuit of FIG. 2.

FIG. 3 shows a diagram of the feedback circuit of FIG. 2. Now, when angular frequency $\omega_i$ of the flexural mode, quartz crystal tuning fork resonator 3, capable of vibrating in a flexural mode, a resistance $R_d$ of the drain resistor 7, capacitance $C_g$, $C_d$ of the capacitors 5, 6, crystal impedance $R_{ei}$ of the quartz crystal resonator 3, an input voltage $V_1$, and an output voltage $V_2$ are taken, a feedback rate $\beta_i$ is defined by $\beta_i=|V_2|_i/|V_1|_i$, where i shows vibration order, for example, when i=1 and 2, they are for fundamental mode vibration and second overtone mode vibration.

In addition, load capacitance $C_L$ is given by $C_L=C_gC_d/(C_g+C_d)$, and when $C_g=C_d=C_{gd}$ and Rd>>$R_{ei}$, the feedback rate $\beta_i$ is given by $\beta_i=1/(1+kC_L^2)$, where k is expressed by a function of $\omega_i$, $R_d$ and $R_{ei}$. Also, $R_{ei}$ is approximately equal to series resistance $R_i$.

Thus, it is easily understood from a relationship of the feedback rate $\beta_i$ and load capacitance $C_L$ that the feedback rate of resonance frequency for a fundamental mode vibration and an overtone mode vibration becomes large, respectively, according to decrease of load capacitance $C_L$. Therefore, when $C_L$ has a small value, an oscillation of the overtone mode occurs very easily, instead of that of the fundamental mode. This is the reason why a maximum amplitude of the overtone mode vibration becomes smaller than that of the fundamental mode vibration, and the oscillation of the overtone mode satisfies an amplitude condition and a phase condition simultaneously which are the continuous condition of an oscillation in an oscillating circuit.

As it is also one object of the present invention to provide a quartz crystal oscillator having a flexural mode, quartz crystal tuning fork resonator, capable of vibrating in a fundamental mode and having a high frequency stability (high time accuracy) of an output signal, and having reduced electric current consumption, in this embodiment, load capacitance $C_L$ is less than 10 pF to reduce electric current consumption. To get much reduced electric current consumption, $C_L$ is preferably less than 8 pF because electric current consumption is proportional to $C_L$. Here, $C_L$ does not include stray capacity of an oscillating circuit. Actually, there exists the stray capacity by constructing the oscillating circuit. Therefore, in this embodiment, load capacitance $C_L$ including the stray capacity by constructing the circuit is less than 18 pF.

In addition, in order to suppress a second overtone mode vibration and to obtain a quartz crystal oscillator having an output signal of a frequency of a fundamental mode vibration, the oscillator is constructed so that it satisfies a relationship of $\alpha_1/\alpha_2 > \beta_2/\beta_1$ and $\alpha_1\beta_1 > 1$, where $\alpha_1$ and $\alpha_2$ are an amplification rate of the fundamental mode vibration and the second overtone mode vibration of an amplification circuit, respectively, and $\beta_1$ and $\beta_2$ are a feedback rate of the fundamental mode vibration and the second overtone mode vibration of a feedback circuit, respectively.

In other words, the quartz crystal oscillator is constructed so that a ratio of the amplification rate $\alpha_1$ of the fundamental mode vibration and the amplification rate $\alpha_2$ of the second overtone mode vibration of the amplification circuit is larger than that of the feedback rate $\beta_2$ of the second overtone mode vibration and the feedback rate $\beta_1$ of the fundamental mode vibration of the feedback circuit, and a product of the amplification rate $\alpha_1$ and the feedback rate $\beta_1$ of the fundamental mode vibration is larger than 1. By constructing it like this, it can be provided with reduced electric current consumption and the output signal of the frequency of the fundamental mode vibration because the second overtone mode vibration can be suppressed. In addition, a description of the high frequency stability will be performed later.

Also, characteristics of the amplifier of the amplification circuit constructing the quartz crystal oscillating circuit of this embodiment can be expressed by negative resistance $-RL_i$. For example, when i=1, negative resistance $-RL_1$ is for a fundamental mode vibration and when i=2, negative resistance $-RL_1$ is for a second overtone mode vibration. In this embodiment, the quartz crystal oscillating circuit is constructed so that a ratio of an absolute value of negative resistance, $|-RL_1|$ of the fundamental mode vibration of the amplification circuit and series resistance $R_1$ of the fundamental mode vibration is larger than that of an absolute value of negative resistance, $|-RL_2|$ of the second overtone mode vibration of the amplification circuit and series resistance $R_2$ of the second overtone mode vibration. That is to say, the oscillating circuit is constructed so that it satisfies a relationship of $|-RL_1|/R_1 > |-RL_2|/R_2$. By constructing the oscillating circuit like this, an oscillation of the second overtone mode can be suppressed, as a result, an output signal of a frequency of the fundamental mode vibration can be provided because an oscillation of the fundamental mode generates easily in the oscillating circuit.

Figure 4:
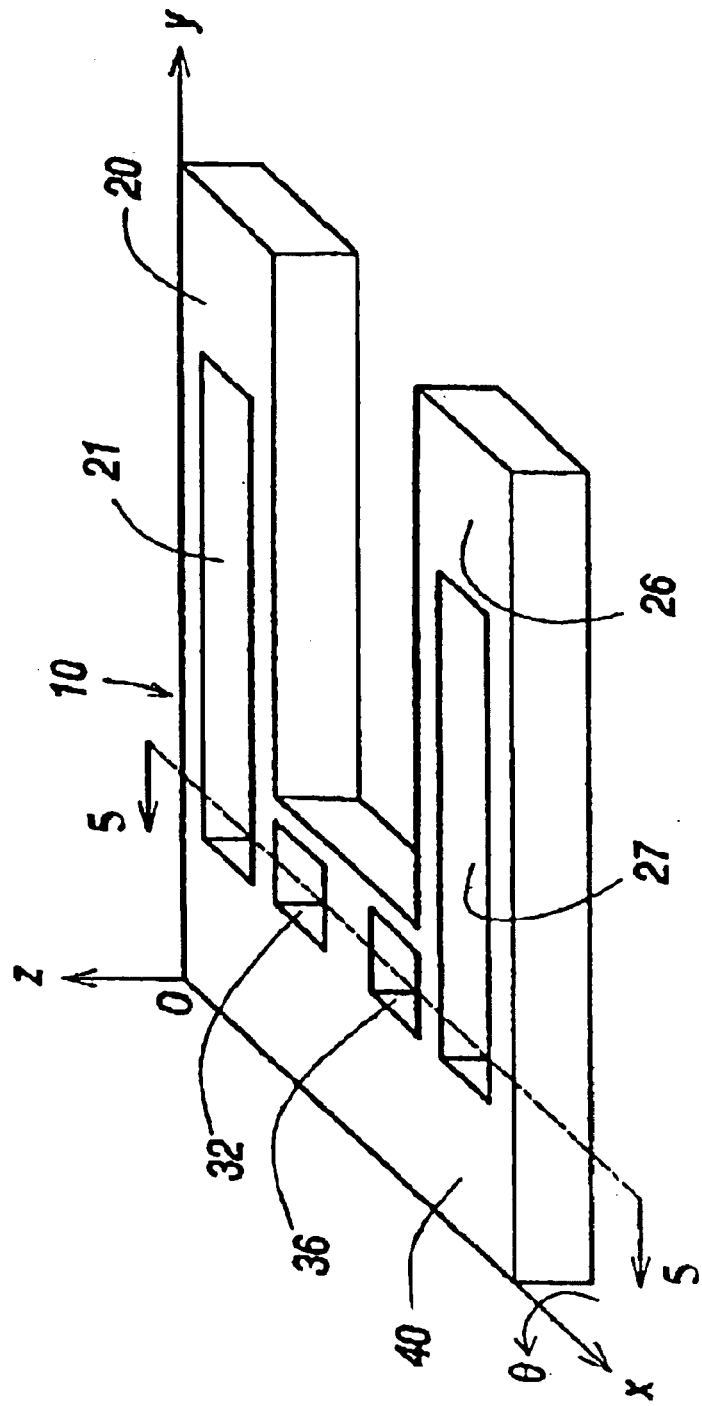
FIG. 4 shows a general view of a flexural mode, quartz crystal tuning fork resonator constructing a quartz crystal oscillator, which constructs an electronic apparatus of the first embodiment of the present invention.

FIG. 4 shows a general view of a flexural mode, quartz crystal tuning fork resonator 10 constructing a quartz crystal oscillator, which constructs an electronic apparatus of the first embodiment of the present invention and its coordinate system o-xyz. A cut angle θ, which has a typical value of 0° to 10°, is rotated from a Z-plate perpendicular to the z axis about the x axis. The quartz crystal resonator 10 comprises two tuning fork tines 20 and 26 and a tuning fork base 40. The tines 20 and 26 have grooves 21 and 27 respectively, with the grooves 21 and 27 extending into the base 40. In addition, the base 40 has the additional grooves 32 and 36.

Figure 5:
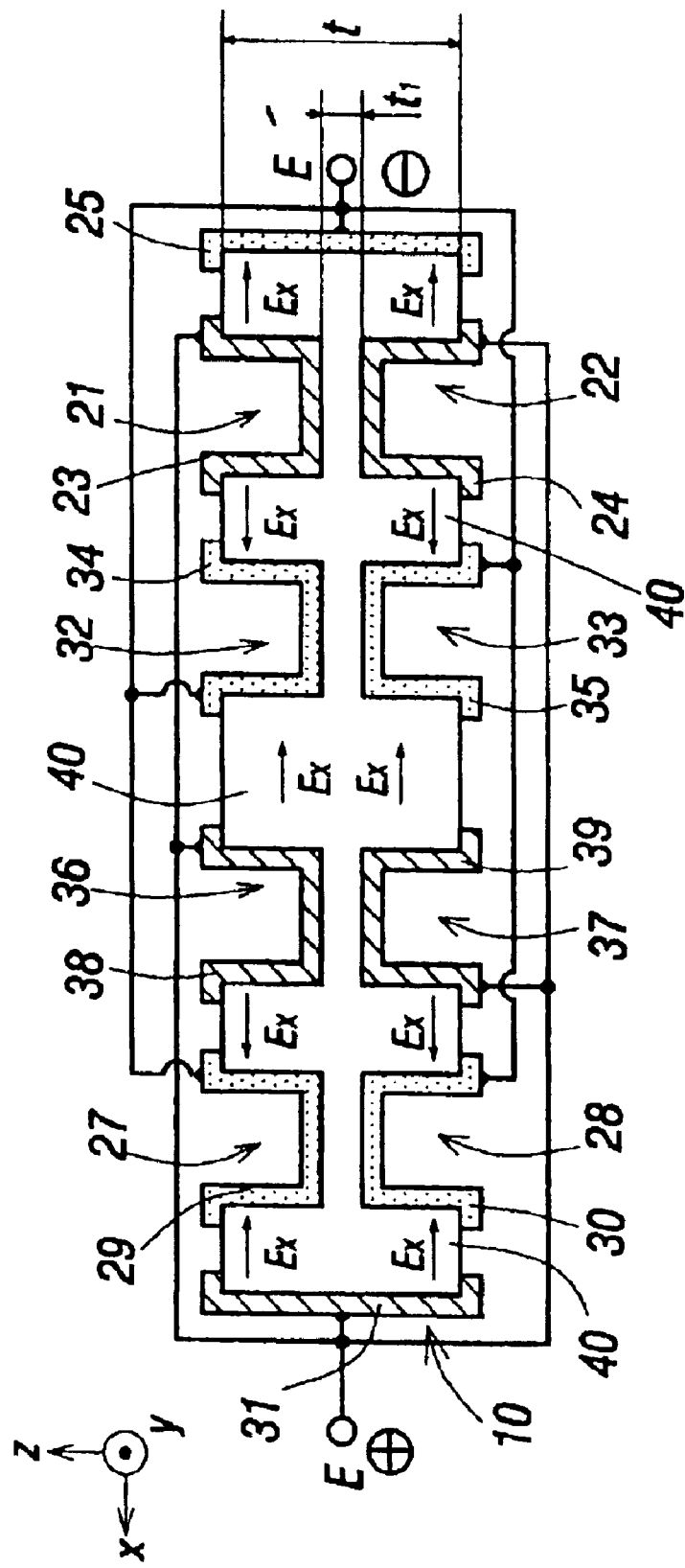
FIG. 5 shows a cross-sectional view of the tuning fork base along line 5—5 of FIG. 4, illustrating an electrode construction.

FIG. 5 shows a cross-sectional view of the tuning fork base 40 for quartz crystal resonator 10 along line 5—5 of FIG. 4. In FIG. 5, the shape of the electrode construction within the base 40 for the quartz crystal resonator of FIG. 4 is described in detail. The section of the base 40 which couples to the tine 20 has the grooves 21 and 22 cut into the obverse and reverse faces of the base 40. Also, the section of the base 40 which couples to the tine 26 has the grooves 27 and 28 cut into the obverse and reverse faces of the base 40. In addition to these grooves, the base 40 has the grooves 32 and 36 cut between the grooves 21 and 27, and also, the base 40 has the grooves 33 and 37 cut between the grooves 22 and 28.

Furthermore, the grooves 21 and 22 have the first electrodes 23 and 24 both of the same electrical polarity, the grooves 32 and 33 have the second electrodes 34 and 35 both of the same electrical polarity, the grooves 36 and 37 have the third electrodes 38 and 39 both of the same electrical polarity, the grooves 27 and 28 have the fourth electrodes 29 and 30 both of same electrical polarity and the sides of the base 40 have the fifth and sixth electrodes 25 and 31, each of opposite electrical polarity. In more detail, the fifth, fourth, and second electrodes 25, 29, 30, 34 and 35 have the same electrical polarity, while the first, sixth and third electrodes 23, 24, 31, 38 and 39 have the opposite electrical polarity to the others. Two electrode terminals E–E' are constructed. That is, the electrodes disposed inside the grooves constructed opposite each other in the thickness (z axis) direction have the same electrical polarity. Also, the electrodes disposed opposite each other across adjoining grooves have opposite electrical polarity.

In addition, the resonator has a thickness t of the tines or the tines and the base, and a groove thickness $t_1$. It is needless to say that the electrodes are disposed inside the grooves and on the sides of the tines. In this embodiment, the first electrodes 23 and 24 are disposed at the tine and the base, and also, the fourth electrodes 29 and 30 are disposed at the tine and the base. In addition, the electrodes are disposed on the sides of the tines opposite each other to the electrodes disposed inside the grooves. Namely, the electrodes are disposed opposite each other inside the grooves and on the sides of the tuning fork tines so that the electrodes disposed opposite each other are of opposite electrical polarity.

Now, when a direct voltage is applied between the electrode terminals E–E' (E terminal: plus, E' terminal: minus), an electric field Ex occurs in the arrow direction as shown in FIG. 5. As the electric field $E_x$ occurs perpendicular to the electrodes disposed on the base, the electric field $E_x$ has a large value and a large distortion occurs at the base, so that a flexural mode, quartz crystal tuning fork resonator is obtained with a small series resistance $R_1$ and a high quality factor $Q_1$, even if it is miniaturized.

Figure 6:
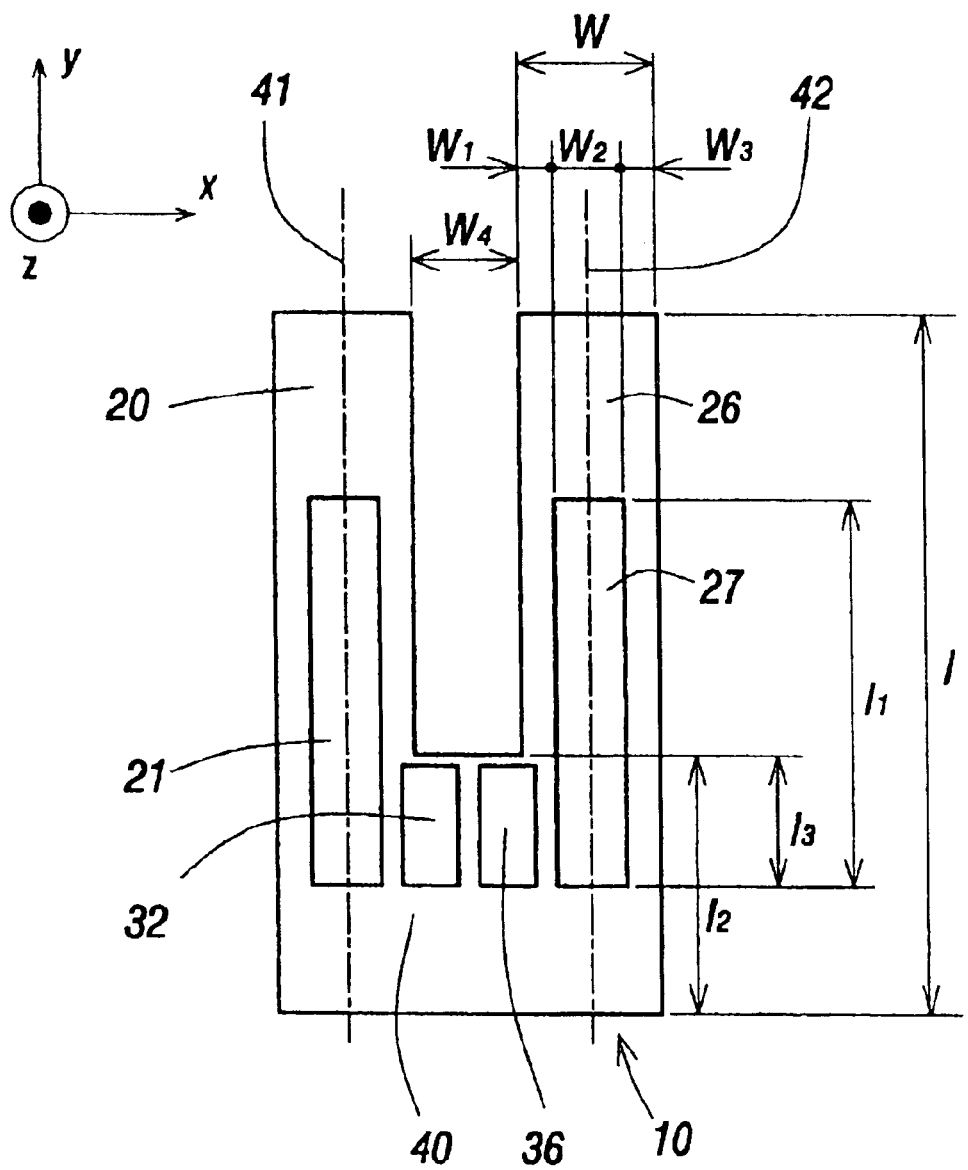
FIG. 6 shows a plan view of a quartz crystal tuning fork resonator of FIG. 4.

FIG. 6 shows a plan view of a quartz crystal tuning fork resonator 10 of FIG. 4. In FIG. 6, the construction and the dimension of grooves 21, 27, 32 and 36 are described in detail. The groove 21 is constructed to include a portion of the central line 41 of the tine 20, the groove 27 is similarly constructed to include a portion of the central line 42 of the tine 26. The width $W_2$ of the grooves 21 and 27 (groove width $W_2$) which include a portion of the central lines 41 and 42 respectively, is preferable because moment of inertia of the tines 20 and 26 becomes large and the times can vibrate in a flexural mode very easily. As a result, the quartz crystal resonator capable of vibrating in a fundamental mode can be obtained with a small series resistance $R_1$ and a high quality factor $Q_1$.

In more detail, when part widths $W_1$, $W_3$ and groove width $W_2$ are taken, the tine width W of the tines 20 and 26 has a relationship of $W=W_1+W_2+W_3$, and a part or all of at least one of the grooves is constructed so that $W_1 \geq W_3$ or $W_1<W_3$. In addition, the groove width $W_2$ is constructed so that $W_2 \geq W_1$, $W_3$. In this embodiment, also, the grooves are constructed at the tines so that a ratio($W_2/W$) of the groove width $W_2$ and the tine width W is larger than 0.35 and less than 1, and a ratio($t_1/t$) of the groove thickness $t_1$ and the thickness t of the tines (tine thickness t) is less than 0.79, to obtain very large moment of inertia of the tines. That is, the quartz crystal resonator, capable of vibrating in the fundamental mode, and having a high frequency stability can be provided with a small series resistance $R_1$, a high quality factor $Q_1$ and a small capacitance ratio $r_1$ because electromechanical transformation efficiency becomes large.

Likewise, length $l_1$ of the grooves 21 and 27 of the tines 20 and 26 extends into the base 40 in this embodiment (which has a dimension of the length $l_2$ and the length $l_3$ of the grooves). Therefore, groove length and length of the tines are given by $(l_1-l_3)$ and $(l-l_2)$, and a ratio of $(l_1-l_3)$ and $(l-l_2)$ is within a range of 0.4 to 0.8 to get a flexural mode, quartz crystal resonator with series resistance $R_1$ of a fundamental mode vibration smaller than series resistance $R_2$ of a second overtone mode vibration Furthermore, the total length l is determined by the frequency requirement and the size of the housing case. Also, to get a flexural mode, quartz crystal resonator capable of vibrating in a fundamental mode with suppression of the second overtone mode vibration which is unwanted mode vibration, there is a close relationship between the groove length $l_1$ and the total length l. Namely, a ratio($l_1/l$) of the groove length $l_1$ and the total length l is within a range of 0.2 to 0.78 because the quantity of charges which generate within the grooves and on the sides of the tines or the tines and the base can be controlled by the ratio, as a result, the second overtone mode vibration, which is unwanted mode vibration, can be suppressed substantially, and simultaneously, a frequency stability of the fundamental mode vibration gets high. Therefore, the flexural mode, quartz crystal tuning fork resonator, capable of vibrating easily in the fundamental mode and having the high frequency stability can be provided.

In more detail, series resistance $R_1$ of the fundamental mode vibration becomes smaller than series resistance $R_2$ of the second overtone mode vibration. Namely, $R_1<R_2$, preferably, $R_1<0.86R_2$, therefore, a quartz crystal oscillator comprising an amplifier(CMOS inverter), capacitors, resistors and a quartz crystal unit with the quartz crystal tuning fork resonator of this embodiment can be obtained, which is capable of vibrating in the fundamental mode very easily. In addition, in this embodiment the grooves 21 and 27 of the tines 20 and 26 extend into the base 40 in series, but embodiment of the present invention includes a plurality of grooves divided into the length direction of the tines. In addition, the grooves may be constructed only at the tuning fork tines($l_3=0$).

In this embodiment, the groove length $l_1$ corresponds to electrode length disposed inside the grooves, though the electrode is not shown in FIG. 6, but, when the electrode length is less than the groove length, the length $l_1$ is of the electrode length. Namely, the ratio($l_1/l$) in this case is expressed by a ratio of electrode length $l_1$ of the grooves and the total length l. In order to achieve the above-mentioned object, it may be satisfied with at least one groove with the ratio constructed at the obverse and reverse faces of each tine. As a result, the flexural mode, quartz crystal tuning fork resonator, capable of vibrating very easily in the fundamental mode and having the high frequency stability can be realized. Also, a fork portion of this embodiment has a rectangular shape, but this invention is not limited to this, for example, the fork portion may have a U shape.

In addition, a space of between the tuning fork tines is given by $W_4$, and in this embodiment, the space $W_4$ and the groove width $W_2$ are constructed so that $W_4 \geq W_2$, and more, the space $W_4$ is within a range of 0.05 mm to 0.35 mm and the width $W_2$ is within a range of 0.03 mm to 0.12 mm because it is easy to form a tuning fork shape and grooves of the tines separately by a photo-lithographic process and an etching process, consequently, a frequency stability for a fundamental mode vibration gets higher than that for a second overtone mode vibration. In this embodiment, a quartz crystal wafer with the thickness t of 0.05 mm to 0.12 mm is used.

In more detail, to obtain a flexural mode, quartz crystal tuning fork resonator with a high frequency stability which gives high time accuracy, it is necessary to obtain the resonator whose resonance frequency is not influenced by shunt capacitance because quartz crystal is a piezoelectric material and the frequency stability is very dependent on the shunt capacitance. In order to decrease the influence on the resonance frequency by the shunt capacitance, figure of merit $M_i$ plays an important role. Namely, the figure of merit $M_i$ that expresses inductive characteristics, electromechanical transformation efficiency and a quality factor of a flexural mode, quartz crystal tuning fork resonator, is defined by a ratio $(Q_i/r_i)$ of a quality factor $Q_i$ and capacitance ratio $r_i$, namely, $M_i$ is given by $M_i=Q_i/r_i$, where i shows vibration order of a flexural mode, quartz crystal tuning fork resonator, and for example, when i=1 and 2, figures of merit $M_1$ and $M_2$ are for a fundamental mode vibration and a second overtone mode vibration of the resonator, respectively.

Also, a frequency difference $\Delta f$ of resonance frequency $f_s$ of mechanical series independent on the shunt capacitance and resonance frequency $f_r$ dependent on the shunt capacitance is inversely proportional to the figure of merit $M_i$. The larger the value $M_i$ becomes, the smaller the difference $\Delta f$ becomes. Namely, the influence on the resonance frequency $f_r$ by the shunt capacitance decreases because it is close to the resonance frequency $f_s$. Accordingly, the larger the $M_i$ becomes, the higher the frequency stability of the flexural mode, quartz crystal resonator becomes because the resonance frequency $f_r$ of the resonator is almost never dependent on the shunt capacitance. Namely, the flexural mode, quartz crystal tuning fork resonator can be provided with a high time accuracy.

In detail, a quartz crystal tuning fork resonator capable of vibrating in a flexural mode can be obtained with figure of merit $M_1$ of a fundamental mode vibration larger than figure of merit $M_2$ of a second overtone mode vibration by the above-described tuning fork shape, grooves and dimensions. That is to say, $M_1>M_2$. As an example, when resonance frequency of a flexural mode, quartz crystal tuning fork resonator is about 32.768 kHz for a fundamental mode vibration and the resonator has a value of $W_2/W=0.5$, $t_1/t=0.34$ and $l_1/l=0.48$, though there is a distribution in production, the resonator has a value of $M_1>65$ and $M_2<30$, respectively.

Namely, the flexural mode, quartz crystal tuning fork resonator which is capable of vibrating in the fundamental mode can be provided with high inductive characteristics, good electromechanical transformation efficiency (small capacitance ratio $r_1$ and small series resistance $R_1$) and a high quality factor. As a result, a frequency stability of the fundamental mode vibration becomes higher than that of the second overtone mode vibration, and simultaneously, the second overtone mode vibration can be suppressed because capacitance ratio $r_2$ and series resistance $R_2$ of the second overtone mode vibration become larger than capacitance ratio $r_1$ and series resistance $R_1$ of the fundamental mode vibration, respectively.

Therefore, the resonator capable of vibrating in the fundamental mode vibration can be provided with a high time accuracy because it has the high frequency stability. Consequently, a quartz crystal oscillator comprising the flexural mode, quartz crystal tuning fork resonator of this embodiment outputs a frequency of the fundamental mode vibration as an output signal, and the frequency of the output signal has a very high stability, namely, an excellent time accuracy. In other words, the quartz crystal oscillator of this embodiment has a remarkable effect such that a frequency change by ageing becomes very small. Also, a frequency of a fundamental mode vibration of the present invention is within a range of 10 kHz to 200 kHz. Especially, 32.768 kHz is used widely, and for example, frequency adjustment of the resonator is performed so that a frequency deviation is within a range of −100 PPM to +100 PPM. Therefore, the output signal is used as a clock signal to display time at a display portion of an electronic apparatus of the present invention.

By constructing the space $W_4$ of between the tines, and groove width $W_2$ as described above, it is easy to form the tines and grooves which are provided at the tines separately, namely, by a separate step. However, in order to form the tines and the grooves simultaneously, it is necessary to obtain an optimum dimension of tine thickness t, groove width $W_2$, space $W_4$ of the tines and groove area $S(=l_1 \times W_2)$. For example, when the tine thickness t is within a range of 0.06 mm to 0.15 mm, the groove width $W_2$, the groove area S and the space $W_4$ are constructed so that they are within a range of 0.02 mm to 0.08 mm, 0.023 mm² to 0.098 mm² and 0.05 mm to 0.35 mm, respectively. This is why crystallographic characteristics of quartz crystal and/or a groove shape are used and from the crystallographic characteristics and/or the groove shape, the grooves and the tines are formed simultaneously, namely, by a simultaneous step using a photolithographic process and an etching process. As an example of the groove shape, groove width $W_2$ is not constant along the length direction of tuning fork tines or grooves are divided into the length direction thereof.

In addition, groove length 1 of the present invention is length of grooves constructed at tines so that the ratio($t_1/t$) of the groove thickness $t_1$ and the tine thickness t is less than 0.79, and the ratio($W_2/W$) of the groove width $W_2$ and the tine width W is larger than 0.35 and less than 1, when the grooves are constructed only at the tuning fork tines, and also, when the grooves constructed at the tuning fork tines extend into a base and at least one groove is constructed between the grooves extended into the tuning fork base, groove length $l_1$ of the present invention is length of grooves constructed at the tines and the base(groove length $l_3$).

Namely, when the grooves constructed at the tines extend into the base and at least one groove is not constructed between the grooves extended into the base, the groove length $l_1$ of the present invention is length of grooves constructed at the tines. Also, when the grooves of the tines are divided into the length direction thereof or connected via at least one step portion, the groove length $l_1$ is total length of the length direction satisfying the ratios($t_1/t$) and ($W_2/W$) described above. In addition, the groove thickness $t_1$ of the present invention is the thinnest thickness of the grooves because quartz crystal is an anisotropic material and the groove thickness $t_1$ has a distribution when the grooves are formed by a chemical etching method.

In summary the embodiments shown within FIG. 4 to FIG. 6, the tines have four grooves within the obverse and the reverse faces thereof and electrodes provided inside the grooves as well as electrodes disposed on both sides of the tines. The embodiments of the present invention, however, may have at least one groove within at least one surface of the tines and an electrode inside the at least one groove as well as electrodes disposed on both sides of the tine. Also, it is provided that the first electrode inside the groove and the second electrodes on said side of the tine next to said electrode are of opposite electrical polarity.

Figure 7:
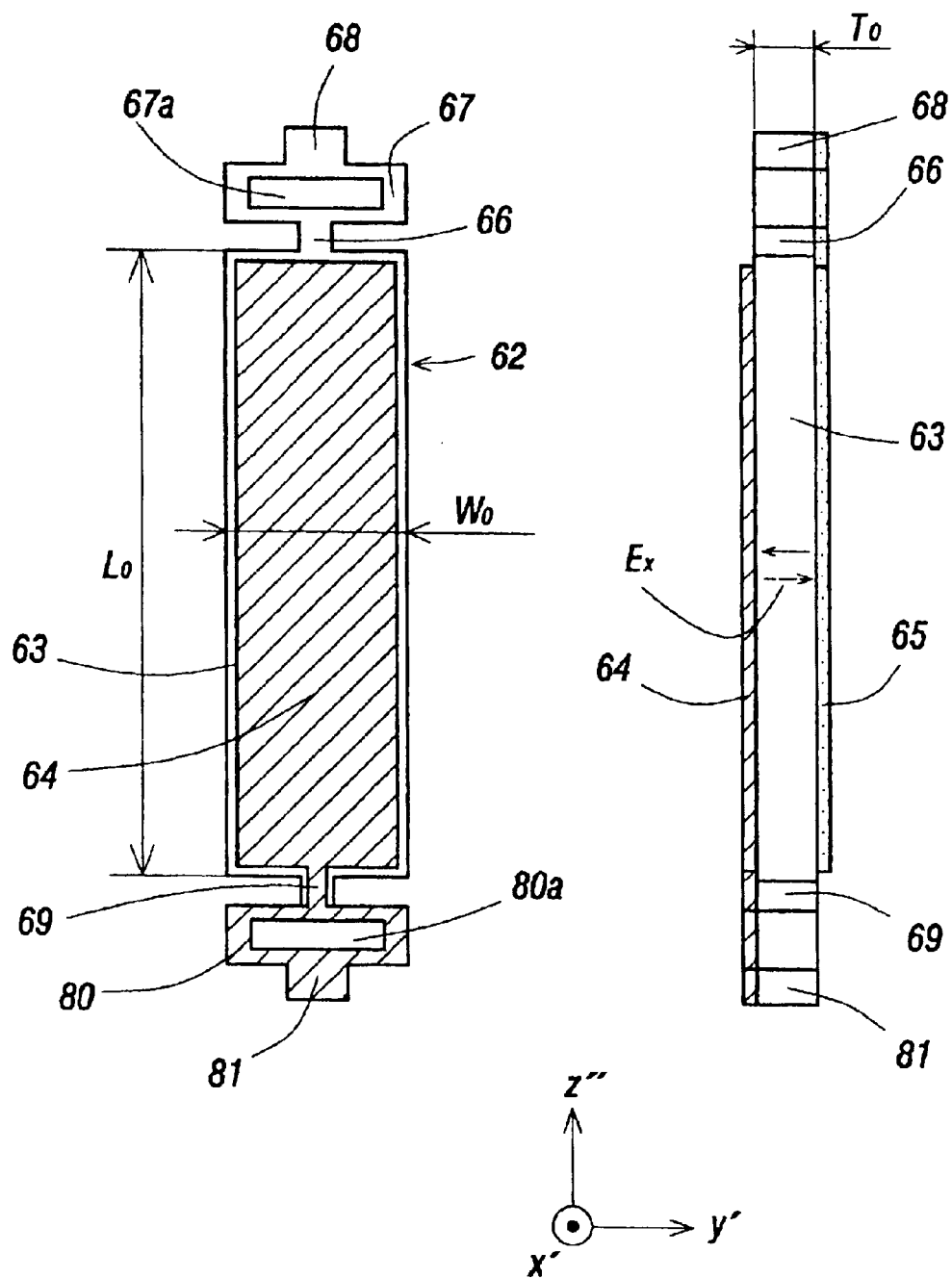
FIG. 7a and FIG. 7b show a top view and a side view of a width-extensional mode quartz crystal resonator constructing a quartz crystal oscillator, which constructs an electronic apparatus of the second embodiment of the present invention.

FIG. 7a and FIG. 7b are a top view and a side view for a width-extensional mode quartz crystal resonator constructing a quartz crystal oscillator, which constructs an electronic apparatus of the second embodiment of the present invention. The resonator 62 comprises vibrational portion 63, connecting portions 66, 69 and supporting portions 67, 80 including respective mounting portions 68, 81. In addition, the supporting portions 67 and 80 have respective holes 67a and 80a. Also, electrodes 64 and 65 are disposed opposite each other on upper and lower faces of the vibrational portion 63, the electrodes have opposite electrical polarities. Namely, a pair of electrodes is disposed on the vibrational portion. In this case, a fundamental mode vibration can be excited easily.

In addition, the electrode 64 extends to the mounting portion 81 through the one connecting portion 69 and the electrode 65 extends to the mounting portion 68 through the other connecting portion 66. In this embodiment, the electrodes 64 and 65 disposed on the vibrational portion 63 extend to the mounting portions of the different direction each other. However, a resonator with the same characteristics as said resonator can be obtained, even if the electrodes 64 and 65 extend to the mounting portions of the same direction each other. The resonator in this embodiment is mounted on fixing portions of a case or a lid at the mounting portions 68 and 81 by conductive adhesives or solder.

With respect to a cutting angle of the width-extensional mode quartz crystal resonator, it is shown here. First, a quartz crystal plate perpendicular to x axis, so called, X plate quartz crystal is taken. Width $W_0$, length $L_0$ and thickness $T_0$ which are each dimension of the X plate quartz crystal correspond to the respective directions of y, z and x axes.

Next, this X plate quartz crystal is, first, rotated with an angle $\theta_x$ of −25° to +25° about the x axis, and second, rotated with an angle $\theta_y$ of −30° to +30° about y' axis which is the new axis of the y axis. In this case, the new axis of the x axis changes to x' axis and the new axis of the z axis changes to z" axis because the z axis is rotated twice about two axes, the width-extensional mode quartz crystal resonator of the present invention is formed from the quartz crystal plate with the rotation angles.

In other words, according to an expression of IEEE notation, a cutting angle of the width-extensional mode quartz crystal resonator of the present invention can be expressed by XZtw(−25°−+25°)/(−30°−+30°). Also, when a turn over temperature point $T_p$ is taken in a vicinity of room temperature, a cutting angle of the width-extensional mode quartz crystal resonator may be within a range of XZt(−

12°—13.5°) or XZt(−18.5°–19.8°) or XZtw(−13°—18°)/± (+0.5°–+30°). Namely, said three kinds of cutting angles in this embodiment is in the same direction as the cutting angle of the DT cut quartz crystal resonator, which is formed from a rotated Y-plate about the x axis whose Y-plate is perpendicular to the y axis.

Moreover, the vibrational portion 63 has a dimension of width $W_0$, length $L_0$ and thickness $Z_0$, also, width $W_0$, length $L_0$ and thickness $T_0$ correspond to y', z" and x' axes, respectively. That is, the electrodes 64 and 65 are disposed on the upper and lower faces of the vibrational portion 63 perpendicular to the x' axis.

In addition, the vibrational portion 63 has a dimension of length $L_0$ greater than width $W_0$ and thickness $T_0$ smaller than the width $W_0$. Namely, a coupling between width-extensional mode and length-extensional mode gets as small as it can be ignored, as a result of which, the quartz crystal resonator can vibrate in a single width-extensional mode, and also, a width-to-length ratio ($W_0/L_0$) has a value smaller than 0.7 to provide the resonator with a small series resistance $R_1$ by increasing electrode area of the vibrational portion. In addition, a thickness-to-width ratio ($T_0/W_0$) has a value smaller than 0.85 to provide the resonator with a small $R_1$ by increasing the intensity of an electric field $E_x$. These actual dimensions are, therefore, determined by the requirement characteristics for the width-extensional mode quartz crystal resonator.

In more detail, resonance frequency of the width-extensional mode quartz crystal resonator is inversely proportional to width $W_0$, and it is almost independent on such an other dimension as length $L_0$, thickness $T_0$, connecting portions and supporting potions. Also, in order to obtain a width-extensional mode quartz crystal resonator with a frequency of 4 Mhz, the width $W_0$ is about 0.7 mm. Thus, the miniature width-extensional mode quartz crystal resonator is provided with a frequency higher than 4 Mhz because resonance frequency of the resonator is inversely proportional to the width $W_0$. Also, the resonator capable of vibrating in a single width-extensional mode can be obtained from the relation of said dimensions.

Next, a value of a piezoelectric constant $e_{12}$ is described, which is of great importance and necessary to excite a width-extensional mode quartz crystal resonator of the present invention. The larger a value of this piezoelectric constant $e_{12}$ becomes, the higher an electromechanical transformation efficiency becomes. For example, the piezoelectric constant of the present invention $e_{12}$ is within a range of 0.095 C/m$^2$ to 0.18 C/M$^2$ approximately in an absolute value. Also, the piezoelectric constant $e_{12}$ in this embodiment can be calculated from the piezoelectric constants $e_{11}$=0.171 C/m$^2$ and $e_{14}$=−0.0406 C/m$^2$ of quartz crystal. It is easily understood that these are enough large values to obtain a width-extensional mode quartz crystal resonator with a small capacitance ratio r, a small series resistance $R_1$ and a high quality factor Q.

Consequently, a quartz crystal oscillator comprising a quartz crystal oscillating circuit comprising the resonator of this embodiment having a high electromechanical transformation efficiency can be provided with a small series resistance $R_1$ and a high quality factor Q. Also, the quartz crystal oscillating circuit comprises an amplification circuit comprising an amplifier at least and a feedback circuit comprising the quartz crystal resonator and capacitors at least. In detail, the amplification circuit comprises a CMOS inverter and a feedback resistor and the feedback circuit comprises a drain resistor, the resonator, a capacitor of a gate side and a capacitor of a drain side. Therefore, an output signal of the quartz crystal oscillator of this embodiment is used as a clock signal except time display of an electronic apparatus of the present invention.

Now, when an alternating current (AC) voltage is applied between the electrodes 64 and 65 shown in FIG. 7b, an electric field Ex occurs alternately in the thickness direction, as shown by the arrow direction of the solid and broken lines. Consequently, the vibrational portion 63 is capable of extending and contracting in the width direction.

Figure 8:
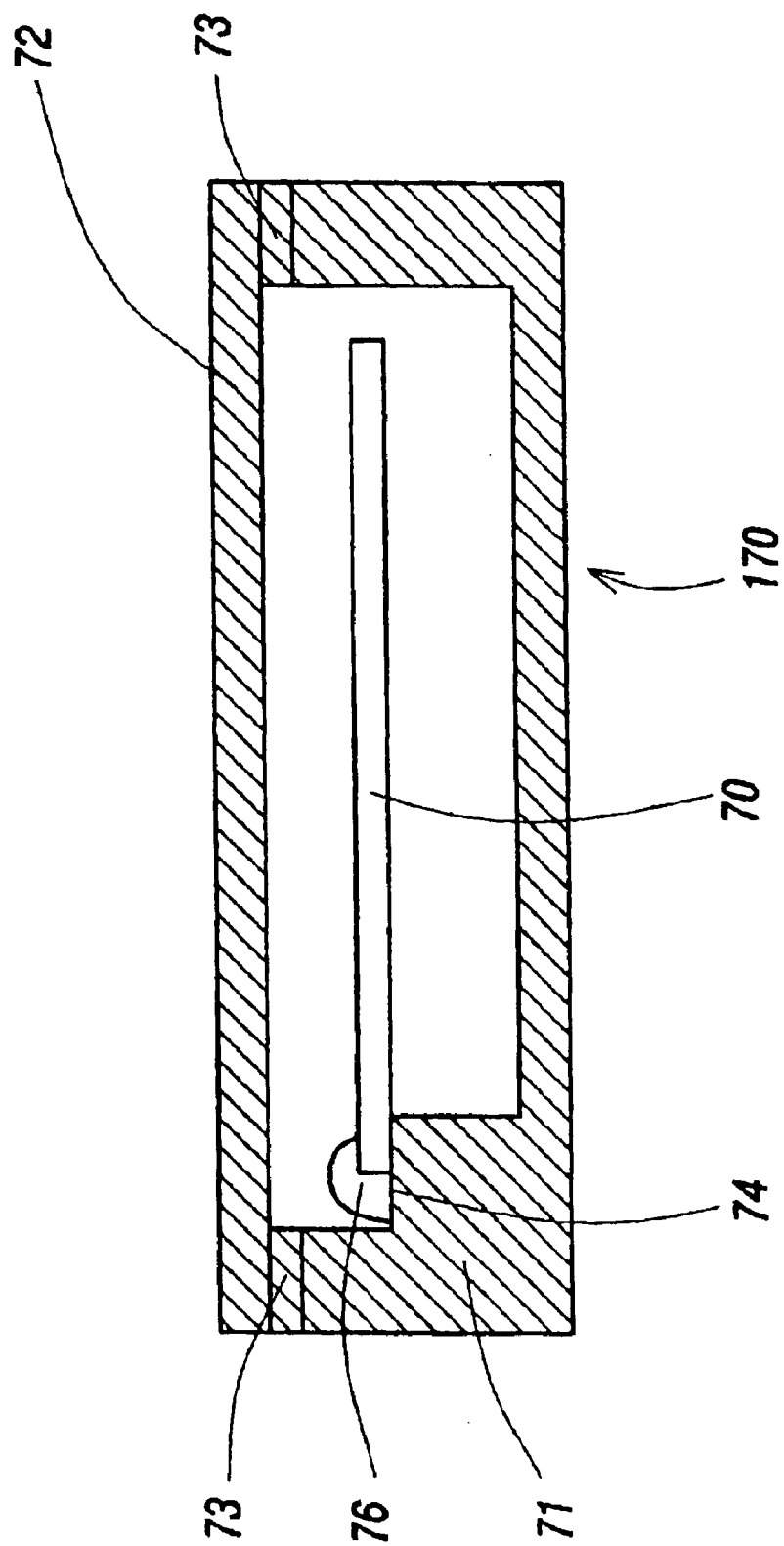
FIG. 8 shows a cross-sectional view of a quartz crystal unit constructing a quartz crystal oscillator, which constructs an electronic apparatus of the third embodiment of the present invention.

FIG. 8 shows a cross-sectional view of a quartz crystal unit constructing a quartz crystal oscillator, which constructs an electronic apparatus of the third embodiment of the present invention. The quartz crystal unit 170 comprises a flexural mode, quartz crystal tuning fork resonator 70, a case 71 and a lid 72. In more detail, the resonator 70 is mounted at a mounting portion 74 of the case 71 by conductive adhesives 76 or solder. Also, the case 71 and the lid 72 are connected through a connecting member 73. The resonator 70 in this embodiment is the same resonator as the flexural mode, quartz crystal tuning fork resonator 10 described in detail in FIG. 4–FIG. 6. Also, in this embodiment, circuit elements are connected at outside of the quartz crystal unit to get a quartz crystal oscillator. Namely, only the quartz crystal tuning fork resonator is housed in the unit and also, it is housed in the unit in vacuum. In this embodiment, the quartz crystal unit of surface mounting type is shown, but the quartz crystal tuning fork resonator may be housed in tubular type.

Figure 9:
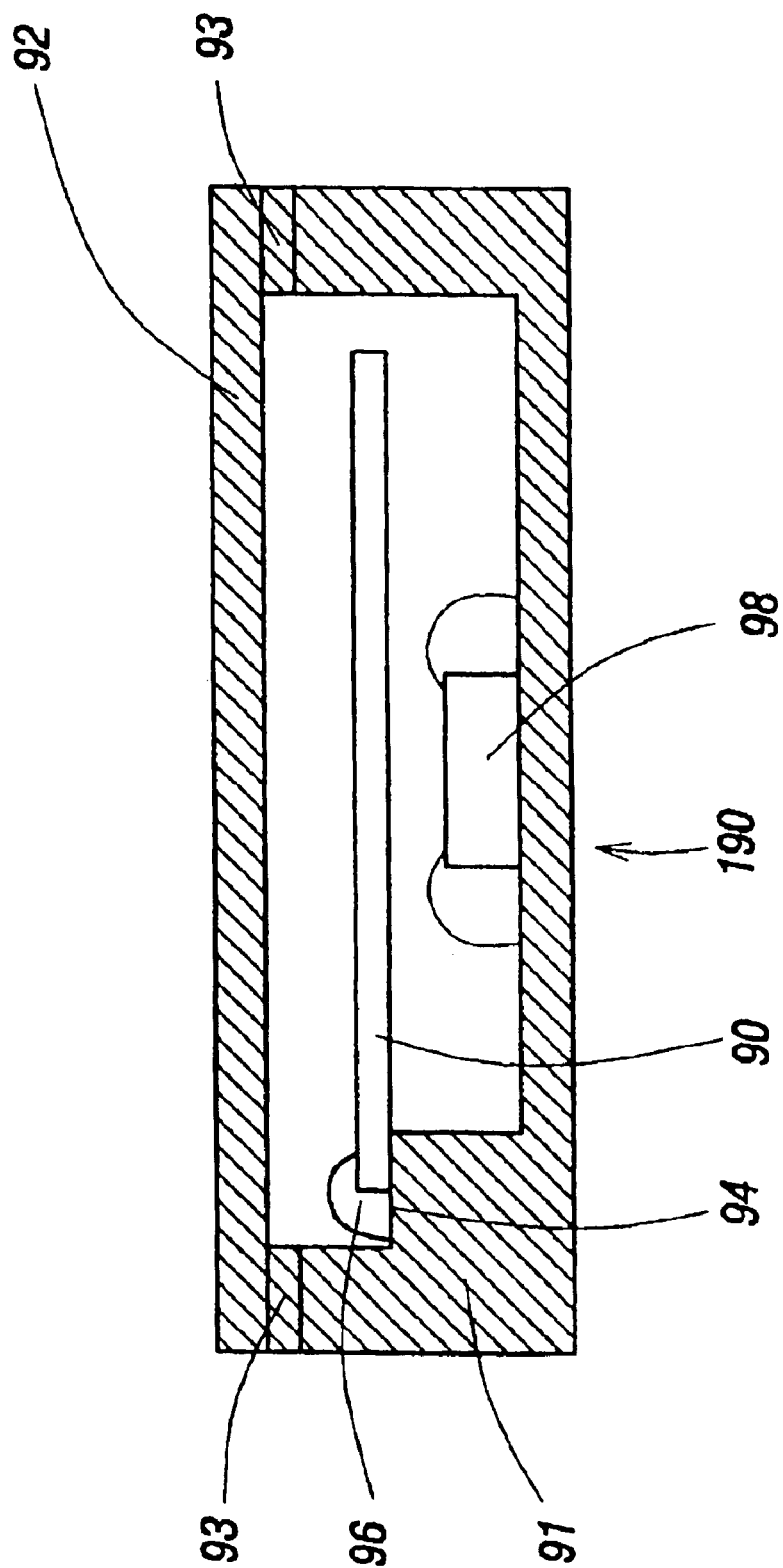
FIG. 9 shows a cross-sectional view of a quartz crystal oscillator, which constructs an electronic apparatus of the fourth embodiment of the present invention.
Figure 10:
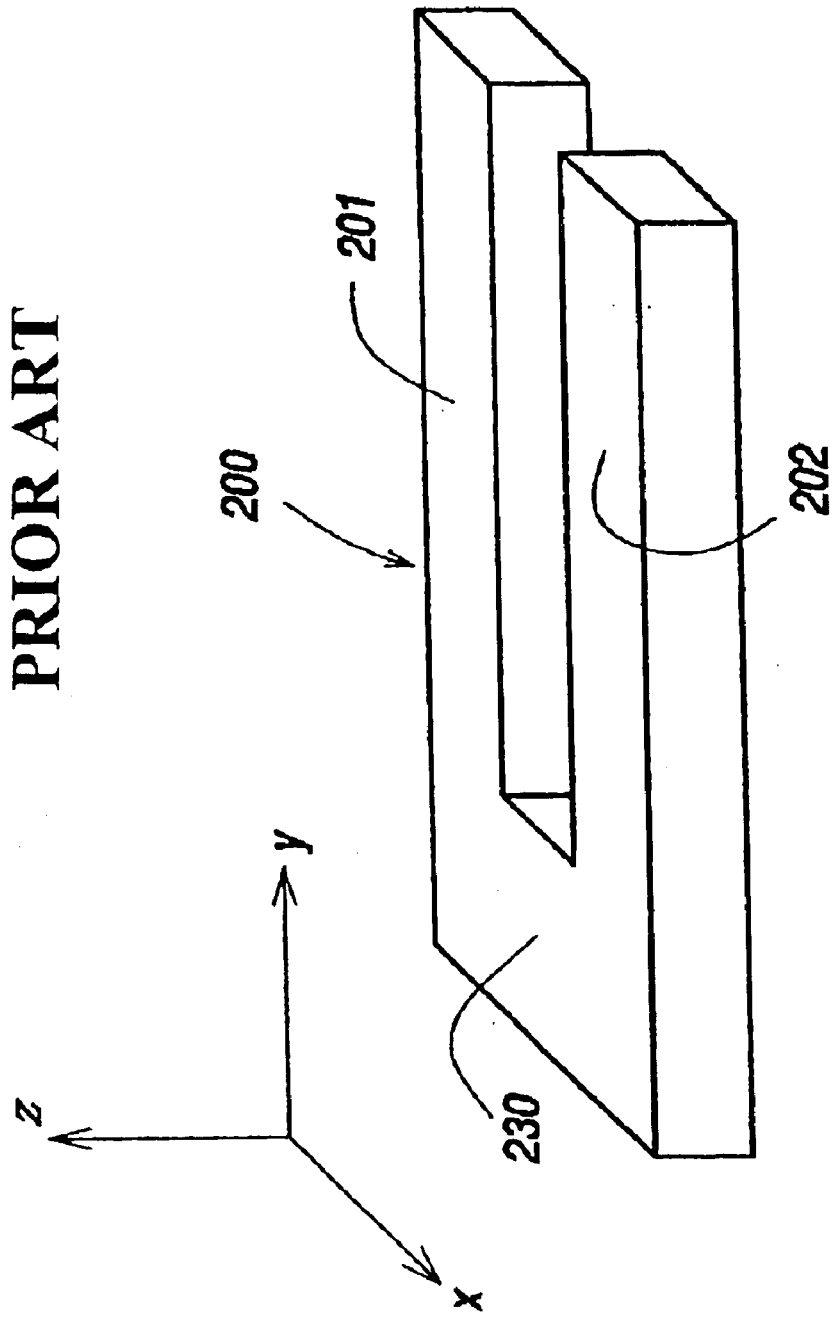
FIG. 10 is a general view of the conventional flexural mode, quartz crystal tuning fork resonator constructing a quartz crystal oscillator of the prior art, which constructs the conventional electronic apparatus.
Figure 11:
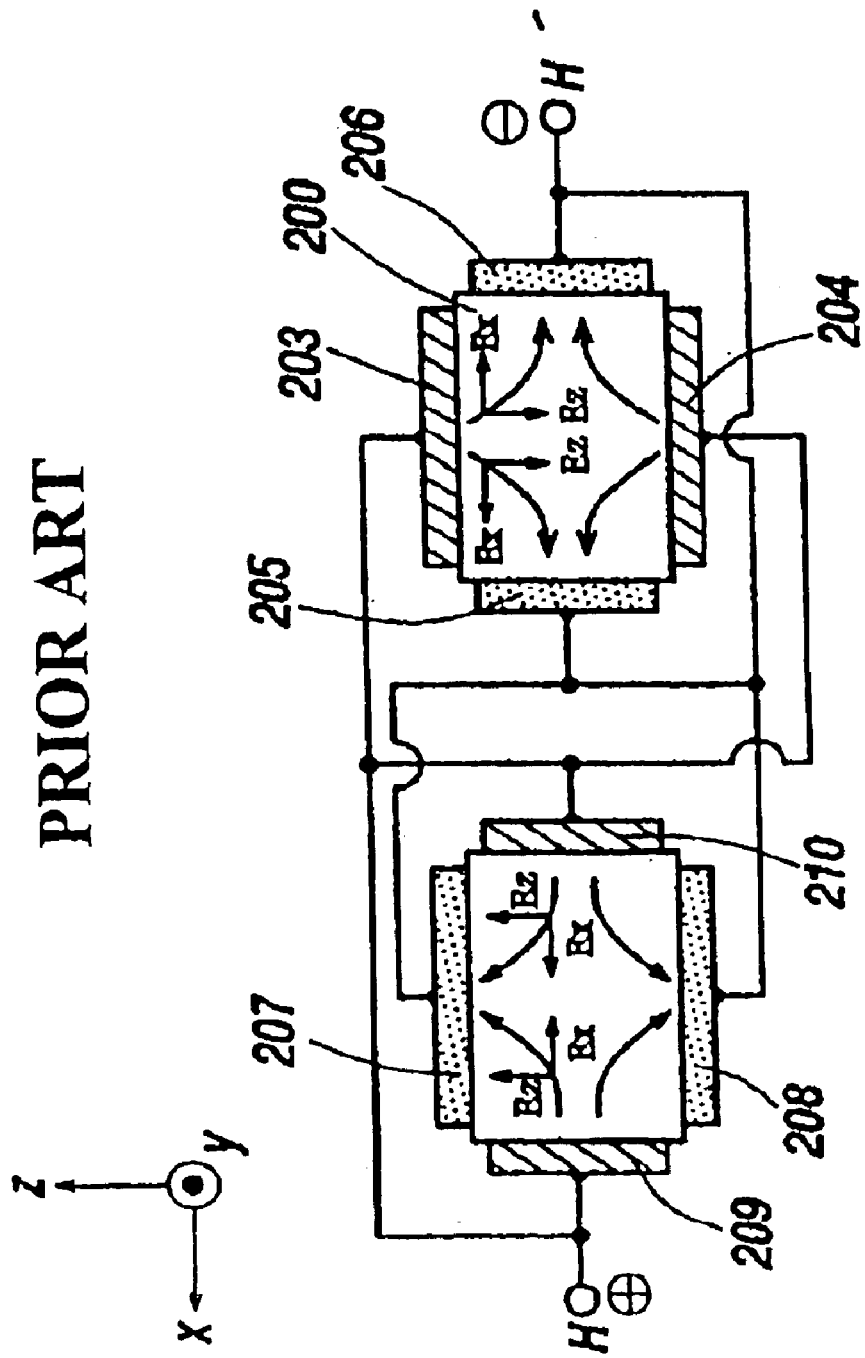
FIG. 11 is a cross-sectional view of the tuning fork tines of FIG. 10 and illustrates an electrode construction.
Figure 12A:
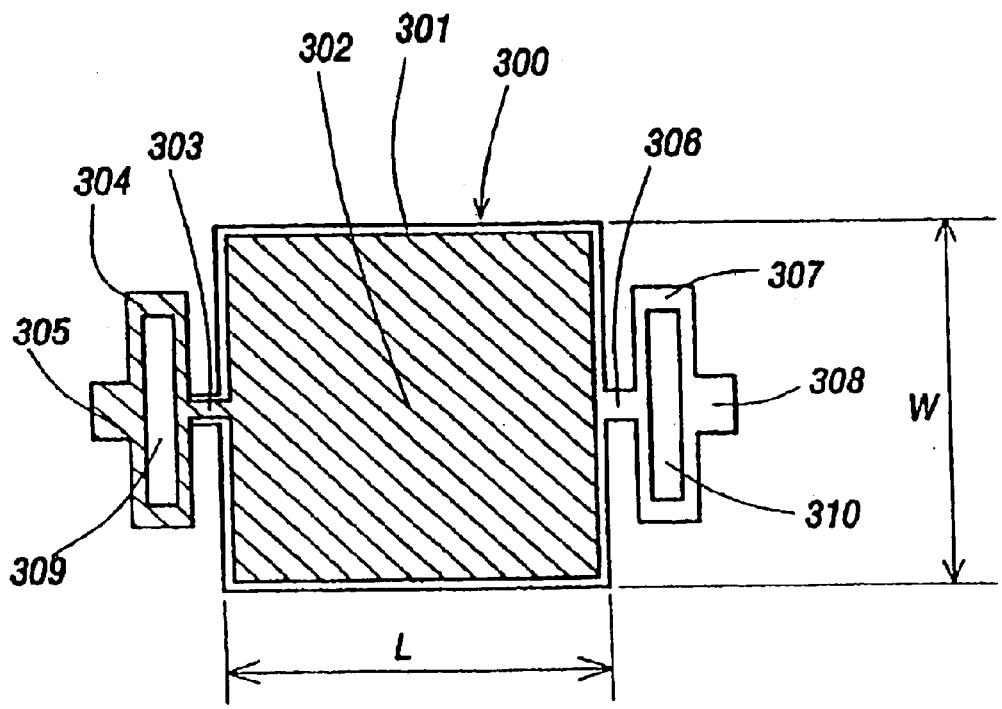
FIG. 12a and FIG. 12b show a top view and a side view of the conventional NS-GT cut coupling quartz crystal resonator constructing a quartz crystal oscillator of the prior art, which constructs the conventional electronic apparatus.
Figure 12B:
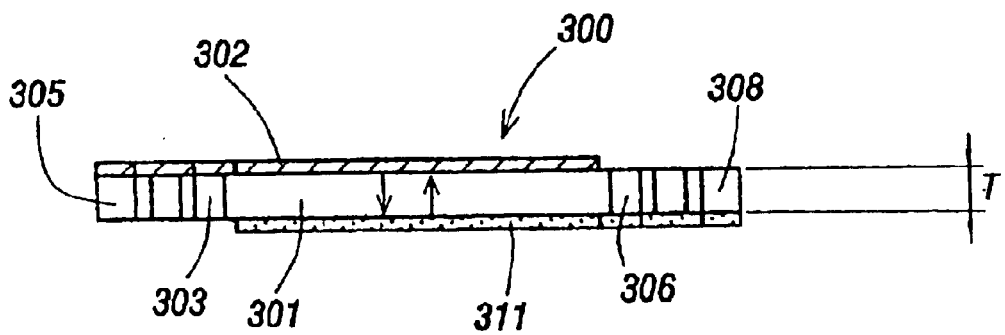

In addition, a member of the case and the lid is ceramics or glass and a metal or glass, respectively, and a connecting member is a metal or glass with low melting point. Also, a relationship of the resonator, the case and the lid described in this embodiment is applied to a quartz crystal oscillator of the present invention which will be described in FIG. 9. In addition, instead of the quartz crystal tuning fork resonator, a width-extensional mode quartz crystal resonator or a thickness shear mode quartz crystal resonator may be housed in the unit, FIG. 9 shows a cross-sectional view of a quartz crystal oscillator, which constructs an electronic apparatus of the fourth embodiment of the present invention. The quartz crystal oscillator 190 comprises a quartz crystal oscillating circuit, a case 91 and a lid 92. In this embodiment, circuit elements constructing the oscillating circuit are housed in a quartz crystal unit comprising a flexural mode, quartz crystal tuning fork resonator 90, the case 91 and the lid 92. Also, the quartz crystal oscillating circuit of this embodiment comprises an amplifier 98 including a feedback resistor, the quartz crystal tuning fork resonator 90, capacitors (not shown here) and a drain resistor (not shown here), and a CMOS inverter is used as the amplifier 98.

In addition, in this embodiment, the resonator 90 is mounted at a mounting portion 94 of the case 91 by conductive adhesives 96 or solder As described above, the amplifier 98 is housed in the quartz crystal unit and mounted at the case 91. Also, the case 91 and the lid 92 are connected through a connecting member 93. The resonator 90 of this embodiment is the same as the flexural mode, quartz crystal tuning fork resonators 10 described in detail in FIG. 4–FIG. 6. In this embodiment, though the resonator and the amplifier are housed in the same room, the present invention is not limited to this, for example, a room of the case is divided into two rooms by a divided portion, and the amplifier is housed in one of the two rooms and the flexural mode, quartz crystal tuning fork resonator is housed in other room. Namely, the resonator and the amplifier are housed in a separate room.

Likewise, in this embodiment, a piece of flexural mode, quartz crystal tuning fork resonator is housed in the unit, but the present invention also includes a quartz crystal unit having a plurality of flexural mode, quartz crystal tuning fork resonators, and at least two of the plurality of resonators are connected electrically in parallel. In addition, the at least two resonators may be an individual resonator or may be individual resonators that are formed integrally at each tuning base through a connecting portion. Also, a divided portion is constructed between the at least two resonators to prevent interference of vibration each other.

In addition, in order to construct a quartz crystal oscillator, two electrode terminals of the resonators are connected electrically to an amplifier, capacitors and resistors. In other words, a quartz crystal oscillating circuit is constructed and connected electrically so that an amplification circuit comprises a CMOS inverter and a feedback resistor and a feedback circuit comprises the flexural mode, quartz crystal tuning fork resonator, the drain resistor, the capacitor of a gate side and the capacitor of a drain side.

In addition, an insulation material such as $S_iO_2$ may be constructed on obverse and reverse faces of the width $W_1$ and the width $W_3$ of the tuning fork tines to prevent a short circuit of between the electrodes of the sides and the grooves thereof, and the insulation material is formed by a spattering method or an evaporation method. Also, when a tuning fork shape comprising tuning fork tines and a tuning fork base is formed by a photo-lithographic process and an etching process, cut portions may be also formed simultaneously at the tuning fork base.

Likewise, in the present embodiment, the flexural mode quartz crystal resonator of tuning fork type has two tuning fork tines, but embodiment of the present invention includes tuning fork tines more than two. In addition, the resonator of the present embodiment is housed in a package (unit) of surface mounting type comprising a case and a lid, but may be housed in a package of tubular type.

In addition, in the present embodiment, the grooves are constructed to include a portion of the central line of the tines, but the present invention is not limited to this, for example, the grooves may be constructed with the portion of the central line of the tines and at both sides thereof. In this case, a part width $W_7$ including the portion the central line of the tines is less than 0.05 mm. Also, each groove width is less than 0.04 mm and a ratio ($t_1/t$) of groove thickness $t_1$ and tine thickness t is less than 0.79. By constructing the part width $W_7$, the groove width and the thickness ratio like this, $M_1$ becomes larger than $M_2$. Namely, the flexural mode, quartz crystal tuning fork resonator, capable of vibrating in a fundamental mode and having a high frequency stability can be provided because the second overtone mode vibration can be suppressed.

In addition, for the flexural mode, quartz crystal tuning fork resonator constructing the quartz crystal oscillators, which construct an electronic apparatus of the present invention, the resonator is constructed so that a capacitance ratio $r_1$ of a fundamental mode vibration gets smaller than a capacitance ratio $r_2$ of a second overtone mode vibration, in order to obtain a frequency change of the fundamental mode vibration larger than that of the second overtone mode vibration, versus the same change of a value of load capacitance $C_L$. Namely, a variable range of a frequency of the fundamental mode vibration gets wider than that of the second overtone mode vibration.

In more detail, for example, when $C_L$=18 pF and the $C_L$ changes in 1 pF, the frequency change of the fundamental mode vibration becomes larger than that of the second overtone mode vibration because the capacitance ratio $r_1$ is smaller than the capacitance ratio $r_2$. Therefore, there is a remarkable effect for the fundamental mode vibration, such that the resonator can be provided with the frequency variable in the wide range, even when the value of load capacitance $C_L$ changes slightly. Accordingly, when a variation of the same frequency is required, the number of capacitors which are used in the quartz crystal oscillators decreases because the frequency change versus load capacitance 1 pF becomes large, as compared with that of the second overtone mode vibration. As a result, the low priced oscillators with an output signal of the fundamental mode vibration can be provided.

Moreover, capacitance ratios $r_1$ and $r_2$ of a flexural mode, quartz crystal tuning fork resonator are given by $r_1 = C_0/C_1$ and $r_2 = C_0/C_2$, respectively, where $C_0$ is shunt capacitance in an electrical equivalent circuit of the resonator, and $C_1$ and $C_2$ are, respectively, motional capacitance of a fundamental mode vibration and a second overtone mode vibration in the electrical equivalent circuit of the resonator. In addition, the flexural mode, quartz crystal tuning fork resonator has a quality factor $Q_1$ for the fundamental mode vibration and a quality factor $Q_2$ for the second overtone mode vibration.

In more detail, the quartz crystal tuning fork resonator of this embodiment is constructed so that the influence on resonance frequency of the fundamental mode vibration by the shunt capacitance becomes smaller than that of the second overtone mode vibration by the shunt capacitance, namely, so that it satisfies a relationship of $r_1/2Q_1^2 < r_2/2Q_2^2$. As a result, the flexural mode, quartz crystal tuning fork resonator, capable of vibrating in the fundamental mode and having a high frequency stability can be provided because the influence on the resonance frequency of the fundamental mode vibration by the shunt capacitance becomes so extremely small as it can be ignored. Also, the present invention replaces $r_1/2Q_1^2$ with $S_1$ and $r_2/2Q_2^2$ with $S_2$, respectively, and here, the $S_1$ and $S_2$ are called "stable factor of frequency" of the fundamental mode vibration and the second overtone mode vibration. That is to say, the $S_1$ and $S_2$ are given by $S_1 = r_1/2Q_1^2$ and $S_2 = r_2/2Q_2^2$, respectively.

The above-described quartz crystal resonators are formed by at least one method of chemical, mechanical and physical methods. The mechanical method, for example, uses a particle such as GC#1000 and the physical method, for example, uses atom or molecule. Therefore, these methods are called "a particle method" here.

As described above, it will be easily understood that the electronic apparatus comprising the quartz crystal oscillator comprising the quartz crystal oscillating circuit having the flexural mode, quartz crystal tuning fork resonator with novel shapes, the novel electrode construction and excellent electrical characteristics, according to the present invention, may have the outstanding effects. Similar to this, it will be easily understood that the electronic apparatus comprising the quartz crystal oscillator having the width-extensional mode quartz crystal resonator with the novel cutting angle, according to the present invention, may have also the outstanding effect. In addition to this, while the present invention has been shown and described with reference to preferred embodiments thereof, it will be understood by those skilled in the art that the changes in shape and electrode construction can be made therein without departing from the spirit and scope of the present invention.

What is claimed is:

1. An electronic apparatus comprising:
   a display portion; and first and second quartz crystal oscillators comprised of first and second quartz crystal oscillating circuits each having a quartz crystal resonator, an amplifier, a plurality of resistors, and a plurality of capacitors, a mode of vibration of the quartz crystal resonator of the first quartz crystal oscillating circuit being different from that of the quartz crystal resonator of the second quartz crystal oscillating circuit;

wherein the quartz crystal resonator of one of the first and second quartz crystal oscillating circuits comprises a quartz crystal tuning fork resonator capable of vibrating in a flexural mode of an inverse phase and having a fundamental mode of vibration and a second overtone mode of vibration, the quartz crystal tuning fork resonator being electrically connected to an amplification circuit having an amplifier and a feedback resistor and to a plurality of capacitors and a drain resistor of a feedback circuit having the quartz crystal tuning fork resonator, and the quartz crystal tuning fork resonator having a quartz crystal tuning fork base, a plurality of quartz crystal tuning fork tines connected to the quartz crystal tuning fork base, and a groove having stepped portions formed in at least one of opposite main surfaces of each of the quartz crystal tuning fork tines;

wherein a merit value $M_1$ of the fundamental mode of vibration of the quartz crystal tuning fork resonator is greater than a merit value $M_2$ of the second overtone mode of vibration thereof so the second overtone mode of vibration thereof is suppressed and a high frequency stability for the fundamental mode vibration thereof is obtained, the merit values $M_1$ and $M_2$ being defined by the ratios $Q_1/r_1$ and $Q_2/r_2$, respectively, where $Q_1$ and $Q_2$ represent a quality factor of the fundamental mode of vibration and the second overtone mode of vibration, respectively, of the quartz crystal tuning fork resonator and $r_1$ and $r_2$ represent a capacitance ratio of the fundamental mode of vibration and the second overtone mode of vibration, respectively, of the quartz crystal tuning fork resonator;

wherein a ratio of an absolute value of negative resistance $-RL_1$ of the fundamental mode of vibration of the amplification circuit and a series resistance $R_1$ of the fundamental mode of vibration is greater than that of an absolute value of negative resistance $-RL_2$ of the second overtone mode of vibration of the amplification circuit and a series resistance $R_2$ of the second overtone mode of vibration; and wherein an output signal of the quartz crystal oscillating circuit comprising the quartz crystal tuning fork resonator is a clock signal for operation of the electronic apparatus to display time information at the display portion, the clock signal having an oscillation frequency of the fundamental mode of vibration of the quartz crystal tuning fork resonator.

2. An electronic apparatus according to claim 1; wherein the oscillation frequency of the fundamental mode of vibration of the quartz crystal tuning fork resonator is within a range of 10 kHz to 200 kHz.

3. An electronic apparatus according to claim 2; wherein the groove formed in at least one of the opposite main surfaces of each of the quartz crystal tuning fork tines has a width $W_2$ and a base portion having a thickness $t_1$; and wherein a ratio $W_2/W$ is greater than 0.35 and less than 1, and a ratio $t_1/t$ is less than 0.79, where W and t represent a width and a thickness, respectively, of each of the quartz crystal tuning fork tines.

4. An electronic apparatus according to claim 3; wherein the thickness $t_1$ of the base portion of the groove is zero to define a through-hole extending between the opposite main surfaces of each of the quartz crystal tuning fork tines.

5. An electronic apparatus according to claim 3; wherein the opposite main surfaces of the quartz crystal tuning fork tines comprise first and second opposite main surfaces each having a central linear portion, the groove being formed in the central linear portion of one of the first and second main surfaces of each of the quartz crystal tuning fork tines and having the width $W_2$ which is greater than or equal to a distance $W_1$ extending between a first side of the groove and a first side of the quartz crystal tuning fork tine and is greater than or equal to a distance $W_3$ extending between a second side of the groove opposite the first side thereof and a second side of the quartz crystal tuning fork tine opposite the first side thereof, the distance $W_1$ being greater than, equal to, or less than the distance $W_3$.

6. An electronic apparatus according to claim 5; wherein the groove has a length $l_1$; and wherein a ratio $l_1/l$ is within a range of 0.2 to 0.78, where l represents an overall length of the quartz crystal tuning fork resonator.

7. An electronic apparatus according to claim 2; wherein the amplifier of the amplification circuit comprises a CMOS inverter.

8. An electronic apparatus according to claim 7; wherein the quartz crystal resonator of one of the first and second quartz crystal oscillating circuits comprises a width-extensional mode quartz crystal resonator capable of vibrating in a width-extensional mode.

9. An electronic apparatus according to claim 7; wherein the quartz crystal resonator of one of the first and second quartz crystal oscillating circuits comprises a thickness shear mode quartz crystal resonator capable of vibrating in a thickness shear mode.

10. An electronic apparatus comprising:

a display portion; and first and second quartz crystal oscillators comprised of first and second quartz crystal oscillating circuits each having a quartz crystal resonator, an amplifier, a plurality of resistors, and a plurality of capacitors, a mode of vibration of the quartz crystal resonator of the first quartz crystal oscillating circuit being different from that of the quartz crystal resonator of the second quartz crystal oscillating circuit;

wherein the quartz crystal resonator of one of the first and second quartz crystal oscillating circuits comprises a quartz crystal tuning fork resonator capable of vibrating in a flexural mode of an inverse phase and having a fundamental mode of vibration and a second overtone mode of vibration, the quartz crystal tuning fork resonator being electrically connected to an amplification circuit having an amplifier and a feedback resistor and to a plurality of capacitors and a drain resistor of a feedback circuit having the quartz crystal tuning fork resonator, and the quartz crystal tuning fork resonator having a quartz crystal tuning fork base, a plurality of quartz crystal tuning fork tines connected to the quartz crystal tuning fork base, and a groove having stepped portions formed in at least one of opposite main surfaces of each of the quartz crystal tuning fork tines;

wherein a merit value $M_1$ of the fundamental mode of vibration of the quartz crystal tuning fork resonator is greater than a merit value $M_2$ of the second overtone mode of vibration thereof so the second overtone mode of vibration thereof is suppressed and a high frequency stability for the fundamental mode vibration thereof is obtained, the merit values $M_1$ and $M_2$ being defined by the ratios $Q_1/r_1$ and $Q_2/r_2$, respectively, where $Q_1$ and $Q_2$ represent a quality factor of the fundamental mode of vibration and the second overtone mode of vibration, respectively, of the quartz crystal tuning fork resonator and $r_1$ and $r_2$ represent a capacitance ratio of the fundamental mode of vibration and the second overtone mode of vibration, respectively, of the quartz crystal tuning fork resonator;

wherein a ratio of an amplification rate $\alpha_1$ of the fundamental mode of vibration and an amplification rate $\alpha_2$ of the second overtone mode of vibration of the amplification circuit is greater than a ratio of a feedback rate $\beta_2$ of the second overtone mode of vibration and a feedback rate $\beta_1$ of the fundamental mode of vibration of the feedback circuit, a product of the amplification rate $\alpha_1$ and the feedback rate $\beta_1$ of the fundamental mode of vibration being greater than 1; and wherein an output signal of the quartz crystal oscillating circuit comprising the quartz crystal tuning fork resonator is a clock signal for operation of the electronic apparatus to display time information at the display portion, the clock signal having an oscillation frequency of the fundamental mode of vibration of the quartz crystal tuning fork resonator.

11. An electronic apparatus according to claim 10; wherein the output signal of the quartz crystal oscillating circuit comprising the quartz crystal tuning fork resonator is outputted through a buffer circuit; and wherein the oscillation frequency of the fundamental mode of vibration of the quartz crystal tuning fork resonator is within a range of 10 kHz to 200 kHz.

12. An electronic apparatus according to claim 11; wherein the amplifier of the amplification circuit comprises a CMOS inverter.

13. An electronic apparatus according to claim 12; wherein a width $W_2$ of the groove formed in at least one of the opposite main surfaces of each of the quartz crystal tuning fork tines is within a range of 0.03 mm to 0.12 mm; and wherein a ratio $W_2/W$ is greater than 0.35 and less than 1, where W represents a width of each of the quartz crystal tuning fork tines.

14. An electronic apparatus according to claim 13; wherein a ratio $t_1/t$ is less than 0.79, where $t_1$ is a thickness of a base portion of the groove formed in at least one of the opposite main surfaces of each of the quartz crystal tuning fork tines and t is a thickness of each of the quartz crystal tuning fork tines; and wherein the thickness $t_1$ is zero to define a through-hole extending between the opposite main surfaces of each of the quartz crystal tuning fork tines.

15. An electronic apparatus according to claim 13; wherein the quartz crystal resonator of one of the first and second quartz crystal oscillating circuits comprises a thickness shear mode quartz crystal resonator capable of vibrating in a thickness shear mode.

16. An electronic apparatus according to claim 12; wherein the merit value $M_2$ for the second overtone mode of vibration of the quartz crystal tuning fork resonator is less than 30.

17. An electronic apparatus according to claim 12; wherein a stable factor $S_1$ of the fundamental mode of vibration of the quartz crystal tuning fork resonator and a stable factor $S_2$ of the second overtone mode of vibration thereof are defined by $r_1/2Q_1^2$ and $r_2/2Q_2^2$, respectively; and wherein $S_1$ is less than $S_2$.

18. An electronic apparatus according to claim 12; wherein a series resistance $R_1$ of the fundamental mode of vibration of the quartz crystal tuning fork resonator is less than a series resistance $R_2$ of the second overtone mode of vibration thereof; and wherein a capacitance ratio $r_1$ of the fundamental mode of vibration of the quartz crystal tuning fork resonator is less than a capacitance ratio $r_2$ of the second overtone mode of vibration thereof.

19. An electronic apparatus according to claim 12; wherein the feedback circuit comprises a capacitor of a gate side having a capacitance $C_g$ and a capacitor of a drain side having a capacitance $C_d$; and wherein a load capacitance $C_L$ of the capacitors is less than 18 pF, where $C_L$ is defined by $C_g C_d/(C_g+C_d)$.

20. An electronic apparatus comprising:
a display portion; and
first and second quartz crystal oscillators comprised of first and second quartz crystal oscillating circuits, respectively, each having a quartz crystal resonator, an amplifier, a plurality of resistors, and a plurality of capacitors, a mode of vibration of the quartz crystal resonator of the first quartz crystal oscillating circuit being different from that of the quartz crystal resonator of the second quartz crystal oscillating circuit;

wherein the quartz crystal resonator of one of the first and second quartz crystal oscillating circuits comprises a width-extensional mode quartz crystal resonator capable of vibrating in a width-extensional mode and having a piezoelectric constant $e_{12}$ within a range of 0.095 C/m$^2$ to 0.18 C/m$^2$ in the absolute value, the width-extensional mode quartz crystal resonator having a vibrational portion having a length greater than a width thereof and a thickness smaller than the width, connecting portions disposed at ends of the vibrational portion, supporting portions connected to the vibrational portion through the connecting portions, and electrodes disposed on upper and lower faces of the vibrational portion; and wherein an output signal of the quartz crystal oscillating circuit comprising the width-extensional mode quartz crystal resonator is a clock signal outputted through a buffer circuit and for operation of the electronic apparatus to display time information at the display portion.

21. An electronic apparatus according to claim 20; a cutting angle of the width-extensional mode quartz crystal resonator is within a range of XZtw(−25°−+25°)/(−30°−+30°).

22. An electronic apparatus according to claim 20; a cutting angle of the width-extensional mode quartz crystal resonator is within a range of XZt(−12−−13.5°) or XZt(−18.5°−−9.8°) or XZtw(−13°−−18°)/±(+0.5°−+30°).

23. An electronic apparatus according to claim 20; wherein quartz crystal oscillating circuit having the width-extensional mode quartz crystal resonator has a CMOS inverter, a feedback resistor, a drain resistor, a capacitor of a gate side, and a capacitor of a drain side.

24. An electronic apparatus comprising:
a display portion; and
first and second quartz crystal oscillators comprised of first and second quartz crystal oscillating circuits each having a quartz crystal resonator, an amplifier, a plurality of resistors, and a plurality of capacitors, a mode of vibration of the quartz crystal resonator of the first quartz crystal oscillating circuit being different from that of the quartz crystal resonator of the second quartz crystal oscillating circuit;

wherein the quartz crystal resonator of one of the first and second quartz crystal oscillating circuits comprises a quartz crystal tuning fork resonator capable of vibrating in a flexural mode of an inverse phase and having a fundamental mode of vibration and a second overtone mode of vibration, the quartz crystal tuning fork resonator being electrically connected to an amplification circuit having an amplifier and a feedback resistor and to a plurality of capacitors and a drain resistor of a feedback circuit having the quartz crystal tuning fork resonator, and the quartz crystal tuning fork resonator having a quartz crystal tuning fork base, a plurality of quartz crystal tuning fork tines connected to the quartz crystal tuning fork base, and a groove having stepped portions formed in a central linear portion of at least one of opposite main surfaces of each of the quartz crystal tuning fork tines so that a width of the groove is greater than or equal to a distance in the width direction of the groove measured from an outer edge of the groove to an outer edge of the quartz crystal tuning fork tine in which the groove is formed;

wherein a merit value $M_1$ of the fundamental mode of vibration of the quartz crystal tuning fork resonator is greater than a merit value $M_2$ of the second overtone mode of vibration thereof so the second overtone mode of vibration thereof is suppressed and a high frequency stability for the fundamental mode vibration thereof is obtained, the merit values $M_1$ and $M_2$ being defined by the ratios $Q_1/r_1$ and $Q_2/r_2$, respectively, where $Q_1$ and $Q_2$ represent a quality factor of the fundamental mode of vibration and the second overtone mode of vibration, respectively, of the quartz crystal tuning fork resonator and $r_1$ and $r_2$ represent a capacitance ratio of the fundamental mode of vibration and the second overtone mode of vibration, respectively, of the quartz crystal tuning fork resonator;

wherein a ratio of an absolute value of negative resistance $-RL_1$ of the fundamental mode of vibration of the amplification circuit and a series resistance $R_1$ of the fundamental mode of vibration is greater than that of an absolute value of negative resistance $-RL_2$ of the second overtone mode of vibration of the amplification circuit and a series resistance $R_2$ of the second overtone mode of vibration; and wherein an output signal of the quartz crystal oscillating circuit comprising the quartz crystal tuning fork resonator is a clock signal for operation of the electronic apparatus to display time information at the display portion, the clock signal having an oscillation frequency of the fundamental mode of vibration of the quartz crystal tuning fork resonator.

25. An electronic apparatus according to claim 24; wherein a spaced-apart distance between the quartz crystal tuning fork tines is within a range of 0.05 mm to 0.35 mm and is greater than or equal to a width of the groove formed in at least one of the opposite main surfaces of each of the quartz crystal tuning fork tines.

26. An electronic apparatus according to claim 24; wherein a length of the groove formed in the central linear portion of one of the opposite main surfaces of each of the quartz crystal tuning fork tines is within a range of 40% to 80% of a length of each of the quartz crystal tuning fork tines.

27. An electronic apparatus according to claim 24; wherein the merit value $M_2$ for the second overtone mode of vibration of the quartz crystal tuning fork resonator is less than 30.

28. An electronic apparatus according to claim 24; wherein the quartz crystal tuning fork tines comprise a first quartz crystal tuning fork tine and a second quartz crystal tuning fork tine, the groove being formed in each of the opposite main surfaces of each of the first and second quartz crystal tuning fork tines and disposed opposite each other in a thickness direction of the first and second quartz crystal tuning fork tines.

29. An electronic apparatus according to claim 28; wherein each of the first and second quartz crystal tuning fork tines has a side surface comprising an outer side surface; and further comprising a plurality of first electrodes disposed in the grooves of the first and second quartz crystal tuning fork tines and a plurality of second electrodes disposed on the outer side surfaces of the first and second quartz crystal tuning fork tines, the second electrodes of each of the first and second quartz crystal tuning fork tines having an electrical polarity opposite to an electrical polarity of the first electrodes of each of the first and second quartz crystal tuning fork tines.

30. An electronic apparatus according to claim 29; wherein the first electrodes disposed in the grooves of the first quartz crystal tuning fork tine are connected to the second electrode disposed on the outer side surface of the second quartz crystal tuning fork tine so that the first electrodes of the first quartz crystal tuning fork tine and the second electrode of the second quartz crystal tuning fork tine define a first electrode terminal; and wherein the second electrode disposed on the outer side surface of the first quartz crystal tuning fork tine is connected to the first electrodes disposed in the grooves of the second quartz crystal tuning fork tine so that the second electrode of the first quartz crystal tuning fork tine and the first electrodes of the second quartz crystal tuning fork tine define a second electrode terminal.

31. An electronic apparatus according to claim 30; wherein when a direct current voltage is applied between the first and second electrode terminals, a direction of an outer electric field generated between the second electrode disposed on the outer side surface of the first quartz crystal tuning fork tine and the first electrode disposed in one of the grooves opposite to the second electrode disposed on the outer side surface of the first quartz crystal tuning fork tine is the same as a direction of an outer electric field generated between the second electrode disposed on the outer side surface of the second quartz crystal tuning fork tine and the first electrode disposed in one of the grooves opposite to the second electrode disposed on the outer side surface of the second quartz crystal tuning fork tine; and wherein the directions of the outer electric fields of the first and second quartz crystal tuning fork tines are generally along an x-axis direction of the quartz crystal tuning fork resonator.

32. An electronic apparatus according to claim 31; wherein no electric field is generated between first electrodes disposed in opposite grooves of the first and second quartz crystal tuning fork tines when a direct current voltage is applied between the first electrodes disposed in the opposite grooves.

33. An electronic apparatus comprising:
a display portion; and
a pair of quartz crystal oscillators each comprised of a quartz crystal oscillating circuit having a quartz crystal resonator, an amplifier, a plurality of resistors, and a plurality of capacitors, a mode of vibration of the quartz crystal resonator of each of the quartz crystal oscillating circuits being different from one another;
wherein the quartz crystal resonator of one of the quartz crystal oscillating circuits comprises a quartz crystal tuning fork resonator capable of vibrating in a flexural mode of an inverse phase and having a fundamental mode of vibration and a second overtone mode of vibration, the quartz crystal tuning fork resonator being electrically connected to an amplification circuit having a CMOS inverter and a feedback resistor and electrically connected to capacitors and a drain resistor of a feedback circuit having the quartz crystal tuning fork resonator, and the quartz crystal tuning fork resonator having a quartz crystal tuning fork base and a plurality of quartz crystal tuning fork tines connected to the quartz crystal tuning fork base, each of the quartz crystal tuning fork tines having a length greater than each of a width and a thickness thereof;

wherein a merit value $M_1$ of the fundamental mode of vibration of the quartz crystal tuning fork resonator is greater than a merit value $M_2$ of the second overtone mode of vibration thereof, the merit values $M_1$ and $M_2$ being defined by the ratios $Q_1/r_1$ and $Q_2/r_2$, respectively, where $Q_1$ and $Q_2$ represent a quality factor of the fundamental mode of vibration and the second overtone mode of vibration, respectively, of the quartz crystal tuning fork resonator and $r_1$ and $r_2$ represent a capacitance ratio of the fundamental mode of vibration and the second overtone mode of vibration, respectively, of the quartz crystal tuning fork resonator;

wherein a ratio of an absolute value of negative resistance $-RL_1$ of the fundamental mode of vibration of the amplification circuit and a series resistance $R_1$ of the fundamental mode of vibration is greater than that of an absolute value of negative resistance $-RL_2$ of the second overtone mode of vibration of the amplification circuit and a series resistance $R_2$ of the second overtone mode of vibration; and wherein an output signal of the quartz crystal oscillating circuit comprising the quartz crystal tuning fork resonator is a clock signal for use in operation of the electronic apparatus to display time information at the display portion, the clock signal having an oscillation frequency of the fundamental mode of vibration of the quartz crystal tuning fork resonator.

34. An electronic apparatus according to claim 33; wherein one of the quartz crystal oscillators comprises a quartz crystal oscillating circuit having a thickness shear mode quartz crystal resonator capable of vibrating in a thickness shear mode.

35. An electronic apparatus according to claim 34; wherein a ratio of an amplification rate $\alpha_1$ of the fundamental mode of vibration and an amplification rate $\alpha_2$ of the second overtone mode of vibration of the amplification circuit is greater than a ratio of a feedback rate $\beta_2$ of the second overtone mode of vibration and a feedback rate $\beta_1$ of the fundamental mode of vibration of the feedback circuit, a product of the amplification rate $\alpha_1$ and the feedback rate $\beta_1$ of the fundamental mode of vibration being greater than 1.

36. An electronic apparatus according to claim 35; wherein the merit value $M_2$ for the second overtone mode of vibration of the quartz crystal tuning fork resonator is less than 30 so that the second overtone mode of vibration thereof is suppressed.

37. An electronic apparatus according to claim 35; wherein the quartz crystal tuning fork tines comprise a first quartz crystal tuning fork tine and a second quartz crystal tuning fork tine; and wherein a first electrode is disposed on each of side surfaces of the first quartz crystal tuning fork tine and a second electrode is disposed on each of side surfaces of the second quartz crystal tuning fork tine so that an electrical polarity of the first electrode is opposite to an electrical polarity of the second electrode.

38. An electronic apparatus according to claim 37; wherein a spaced-apart distance between the quartz crystal tuning fork tines is within a range of 0.05 mm to 0.35 nm; and wherein the merit value $M_1$ for the fundamental mode of vibration of the quartz crystal tuning fork resonator is greater than 65 so that a high frequency stability for the fundamental mode of vibration thereof is obtained.

39. An electronic apparatus according to claim 38; wherein a groove having stepped portions is formed in a central linear portion of at least one of opposite main surfaces of each of the quartz crystal tuning fork tines so that a width of the groove is greater than or equal to a distance in the width direction of the groove measured from an outer edge of the groove to an outer edge of the quartz crystal tuning fork tine in which the groove is formed; and wherein the spaced-apart distance between the quartz crystal tuning fork tines is greater than or equal to the width of the groove formed in at least one of the opposite main surfaces of each of the quartz crystal tuning fork tines.

40. An electronic apparatus comprising:

a display portion; and at least one quartz crystal oscillating circuit comprised of a quartz crystal tuning fork resonator capable of vibrating in a flexural mode of an inverse phase and having a fundamental mode of vibration and a second overtone mode of vibration, a quartz crystal tuning fork base, and a plurality of quartz crystal tuning fork tines connected to the quartz crystal tuning fork base, each of the quartz crystal tuning fork tines having a length greater than each of a width and a thickness thereof, the quartz crystal tuning fork resonator being electrically connected to an amplification circuit having a CMOS inverter and a feedback resistor and electrically connected to capacitors and a drain resistor of a feedback circuit having the quartz crystal tuning fork resonator, a series resistance $R_1$ of the fundamental mode of vibration of the quartz crystal tuning fork resonator being less than a series resistance $R_2$ of the second overtone mode of vibration thereof;

wherein a merit value $M_1$ of the fundamental mode of vibration of the quartz crystal tuning fork resonator is greater than a merit value $M_2$ of the second overtone mode of vibration thereof, the merit values $M_1$ and $M_2$ being defined by the ratios $Q_1/r_1$ and $Q_2/r_2$, respectively, where $Q_1$ and $Q_2$ represent a quality factor of the fundamental mode of vibration and the second overtone mode of vibration, respectively, of the quartz crystal tuning fork resonator and $r_1$ and $r_2$ represent a capacitance ratio of the fundamental mode of vibration and the second overtone mode of vibration, respectively, of the quartz crystal tuning fork resonator;

wherein a ratio of an amplification rate $\alpha_1$ of the fundamental mode of vibration and an amplification rate $\alpha_2$ of the second overtone mode of vibration of the amplification circuit is greater than a ratio of a feedback rate $\beta_2$ of the second overtone mode of vibration and a feedback rate $\beta_1$ of the fundamental mode of vibration of the feedback circuit, a product of the amplification rate $\alpha_1$ and the feedback rate $\beta_1$ of the fundamental mode of vibration being greater than 1; and wherein an output signal of the quartz crystal oscillating circuit comprising the quartz crystal tuning fork resonator is a clock signal for use in operation of the electronic apparatus to display time information at the display portion, the clock signal having an oscillation frequency of the fundamental mode of vibration of the quartz crystal tuning fork resonator.

41. An electronic apparatus according to claim 40; wherein the at least one quartz crystal oscillating circuit comprises a plurality of quartz crystal oscillating circuits each having a quartz crystal resonator, an amplifier, a plurality of resistors, and a plurality of capacitors, at least two of the quartz crystal oscillating circuits vibrating in different vibrational modes; and wherein one of the quartz crystal oscillating circuits comprises a thickness shear mode quartz crystal resonator capable of vibrating in a thickness shear mode.

42. An electronic apparatus according to claim 40; wherein the quartz crystal tuning fork tines comprise a first quartz crystal tuning fork tine and a second quartz crystal tuning fork tine spaced-apart from the first quartz crystal tuning fork tine at a distance within a range of 0.05 mm to 0.35 mm; and wherein a first electrode is disposed on one of side surfaces of the first quartz crystal tuning fork tine and a second electrode is disposed on one of side surfaces of the second quartz crystal tuning fork tine so that the first electrode has an electrical polarity opposite to an electrical polarity of the second electrode.

43. An electronic apparatus according to claim 42; wherein the merit value $M_2$ for the second overtone mode of vibration of the quartz crystal tuning fork resonator is less than 30 so that the second overtone mode of vibration thereof is suppressed; and wherein the output signal of the quartz crystal oscillating circuit is outputted through a buffer circuit and has an oscillation frequency of about 32.768 kHz with a frequency deviation within a range of −100 PPM to +100 PPM.

* * * * *